(12) United States Patent
Park et al.

(10) Patent No.: US 9,876,013 B1
(45) Date of Patent: Jan. 23, 2018

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Seung Ju Park, Hwaseong-si (KR); Jeong Yun Lee, Yongin-si (KR); Kyung Seok Min, Yongin-si (KR); Geum Jung Seong, Seoul (KR); Bo Ra Lim, Seoul (KR); Seung Soo Hong, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/477,554

(22) Filed: Apr. 3, 2017

(30) Foreign Application Priority Data

Aug. 24, 2016 (KR) ........................ 10-2016-0107749

(51) Int. Cl.
| | |
|---|---|
| *H01L 23/48* | (2006.01) |
| *H01L 27/088* | (2006.01) |
| *H01L 29/423* | (2006.01) |
| *H01L 21/8234* | (2006.01) |
| *H01L 29/66* | (2006.01) |

(52) U.S. Cl.
CPC .. *H01L 27/0886* (2013.01); *H01L 21/823431* (2013.01); *H01L 21/823468* (2013.01); *H01L 29/42356* (2013.01); *H01L 29/66545* (2013.01)

(58) Field of Classification Search
CPC ........... H01L 27/0886; H01L 29/42356; H01L 29/66454; H01L 21/823431; H01L 21/823466
See application file for complete search history.

(56) References Cited

U.S. PATENT DOCUMENTS

| | | | |
|---|---|---|---|
| 7,309,626 B2 | 12/2007 | Ieong et al. | |
| 8,455,354 B2 | 6/2013 | Chen et al. | |
| 8,652,889 B2 | 2/2014 | Wei et al. | |
| 8,847,295 B2 | 9/2014 | Shieh et al. | |
| 9,257,529 B2 | 2/2016 | Metz | |
| 9,543,298 B1 * | 1/2017 | Zang | ................... H01L 27/0886 |
| 9,553,093 B1 * | 1/2017 | Seo | ..................... H01L 27/0924 |

(Continued)

FOREIGN PATENT DOCUMENTS

| | | |
|---|---|---|
| JP | 5128110 B2 | 11/2012 |
| KR | 10-2015-0106376 A | 9/2015 |
| KR | 10-2016-0056693 A | 5/2016 |

*Primary Examiner* — Nicholas Tobergte
(74) *Attorney, Agent, or Firm* — Ward and Smith, P.A.

(57) ABSTRACT

A semiconductor device is provided including first and second active fin arrays on a substrate. The semiconductor device further includes a pair of first gate spacers disposed on the first and second active fin arrays, each of the pair of first gate spacers including a first region having a first width, a second region having a second width, and a third region between the first region and the second region and having a third width; and first and second gate electrodes, the first gate electrode disposed between the first regions and the second gate electrode disposed between the second regions. The first regions are on the first active fin array, the second regions are on the second active fin array, and the third regions are between the first active fin array and the second active fin array. Each of the first and second widths is greater than the third width.

20 Claims, 24 Drawing Sheets

(56) References Cited

U.S. PATENT DOCUMENTS

| | | | |
|---|---|---|---|
| 9,620,425 B1* | 4/2017 | Zang | H01L 21/845 |
| 9,640,436 B1* | 5/2017 | Cheng | H01L 21/76897 |
| 9,698,230 B2* | 7/2017 | Cheng | H01L 29/41791 |
| 2008/0042202 A1 | 2/2008 | Ieong et al. | |
| 2014/0319623 A1 | 10/2014 | Tsai et al. | |
| 2016/0043079 A1 | 2/2016 | Chang et al. | |
| 2016/0133632 A1 | 5/2016 | Park et al. | |

* cited by examiner

SEMICONDUCTOR DEVICES AND METHODS OF MANUFACTURING THE SAME

CROSS-REFERENCE TO RELATED APPLICATION

This application claims priority under 35 U.S.C. §119 to Korean Patent Application No. 10-2016-0107749, filed on Aug. 24, 2016, in the Korean Intellectual Property Office, the disclosure of which is incorporated by reference herein in its entirety.

FIELD

The present inventive concept relates generally to semiconductor devices and, more particularly, to semiconductor devices having active arrays and a methods of manufacturing the same.

BACKGROUND

Recently, a semiconductor device has been miniaturized and highly functionalized. Thus, the minute structural difference of a transistor included in a semiconductor device makes a great influence on the performance of the semiconductor device. Generally, a transistor includes a polysilicon gate electrode. However, in order to satisfy performance requirements, the polysilicon gate electrode has been replaced by a metal gate electrode. As a process of forming the metal gate electrode, there may be a gate last process or a replacement gate process.

SUMMARY

Aspects of the present inventive concept provide a method of manufacturing a semiconductor device, by which the production yield of a semiconductor device can be improved by removing some or all of regions of a gate spacer at the time of node separation of a dummy gate electrode.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to some embodiments of the present inventive concept, there is provided a semiconductor device, comprising a first active fin array and a second active fin array, which are disposed on a substrate to extend in a first direction and are spaced apart from each other in a second direction crossing the first direction, a pair of first gate spacers, which are disposed on the first and second active fin arrays to extend in the second direction and each of which includes a first region having a first width, a second region having a second width, and a third region disposed between the first region and the second region and having a third width and first and second gate electrodes, which are spaced apart from each other, and in which the first gate electrode is disposed between the first regions of the pair of first gate spacers and the second gate electrode is disposed between the second regions of the pair of first gate spacers, wherein the first regions of the pair of first gate spacers are disposed on the first active fin array, the second regions of the pair of first gate spacers are disposed on the second active fin array, and the third regions of the pair of first gate spacers are disposed between the first active fin array and the second active fin array, and wherein each of the first and second widths is greater than the third width.

According to some embodiments of the present inventive concept, there is provided a semiconductor device, comprising, a first active fin array and a second active fin array, which are disposed on a substrate to extend in a first direction and are spaced apart from each other in a second direction crossing the first direction, a first gate electrode which overlaps the first active fin array and does not overlap the second active fin array, a second gate electrode which overlaps the second active fin array and does not overlap the first active fin array and which is spaced apart from the first gate electrode in the second direction, an insulator which is disposed between the first gate electrode and the second gate electrode, a first gate spacer which is disposed on one sidewall of the first gate electrode, one sidewall of the second gate electrode and one sidewall of the insulator, a second gate spacer which is disposed on the other sidewall of the first gate electrode and a third gate spacer which is disposed on the other sidewall of the second gate electrode, wherein the first gate spacer includes a first recess formed on an inner sidewall of the first gate spacer, and a part of the insulator is inserted into the first recess.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION OF THE EMBODIMENTS

Figure 1:
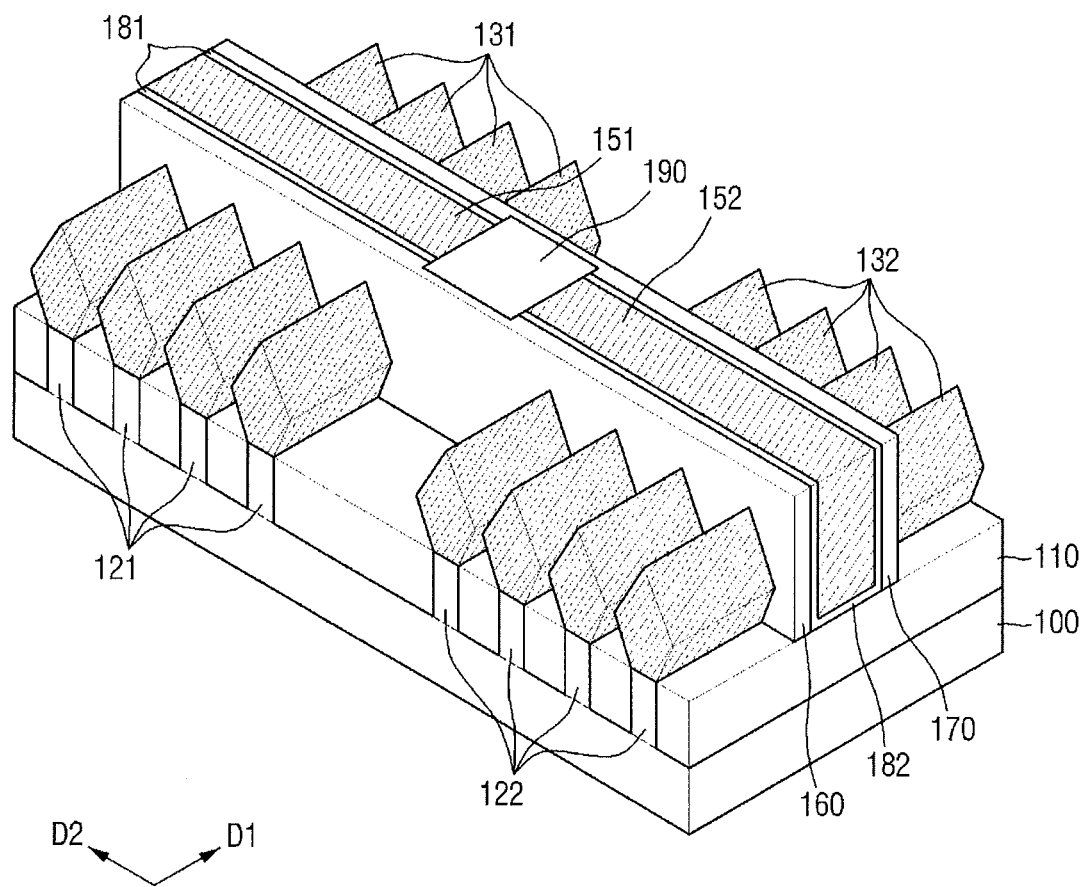
FIG. 1 is a perspective view of a semiconductor device according to some embodiments of the present inventive concept.

Hereinafter, the inventive concept will be described in detail by explaining example embodiments of the invention with reference to the attached drawings. Like reference numerals in the drawings denote like elements and, thus, detailed descriptions thereof will be omitted in the interest of brevity.

The inventive concept may be embodied in many different font's and should not be construed as limited to the example embodiments set forth herein. Rather, these embodiments are provided so that this disclosure will be thorough and complete, and will fully convey the scope of the inventive concept to those skilled in the art. In the drawings, lengths and sizes of layers and regions may be exaggerated for clarity.

Furthermore, though terms like 'first' and 'second' are used to describe various elements, components, regions, layers, and/or portions in various embodiments of the inventive concept, the elements, components, regions, layers, and/or portions should not be limited by these terms. These terms are only used to distinguish one element, component, region, layer, or portion from another. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment can be embodied in a different manner, a specified process order may be performed in a different manner. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. As used herein, the term "and/or" includes any and all combinations of one or more of the associated listed items. Expressions such as "at least one of," when preceding a list of elements, modify the entire list of elements and do not modify the individual elements of the list. A terminology such as "substrate" may denote a substrate itself, or a stack structure including a substrate and predetermined layers or films formed on a surface of the substrate. In addition, a terminology "surface of substrate" may denote an exposed surface of the substrate itself, or an external surface of a predetermined layer or a film formed on the substrate.

Hereinafter, a semiconductor device according to some embodiments of the present inventive concept will be discussed with reference to FIGS. 1 to 6.

Figure 2:
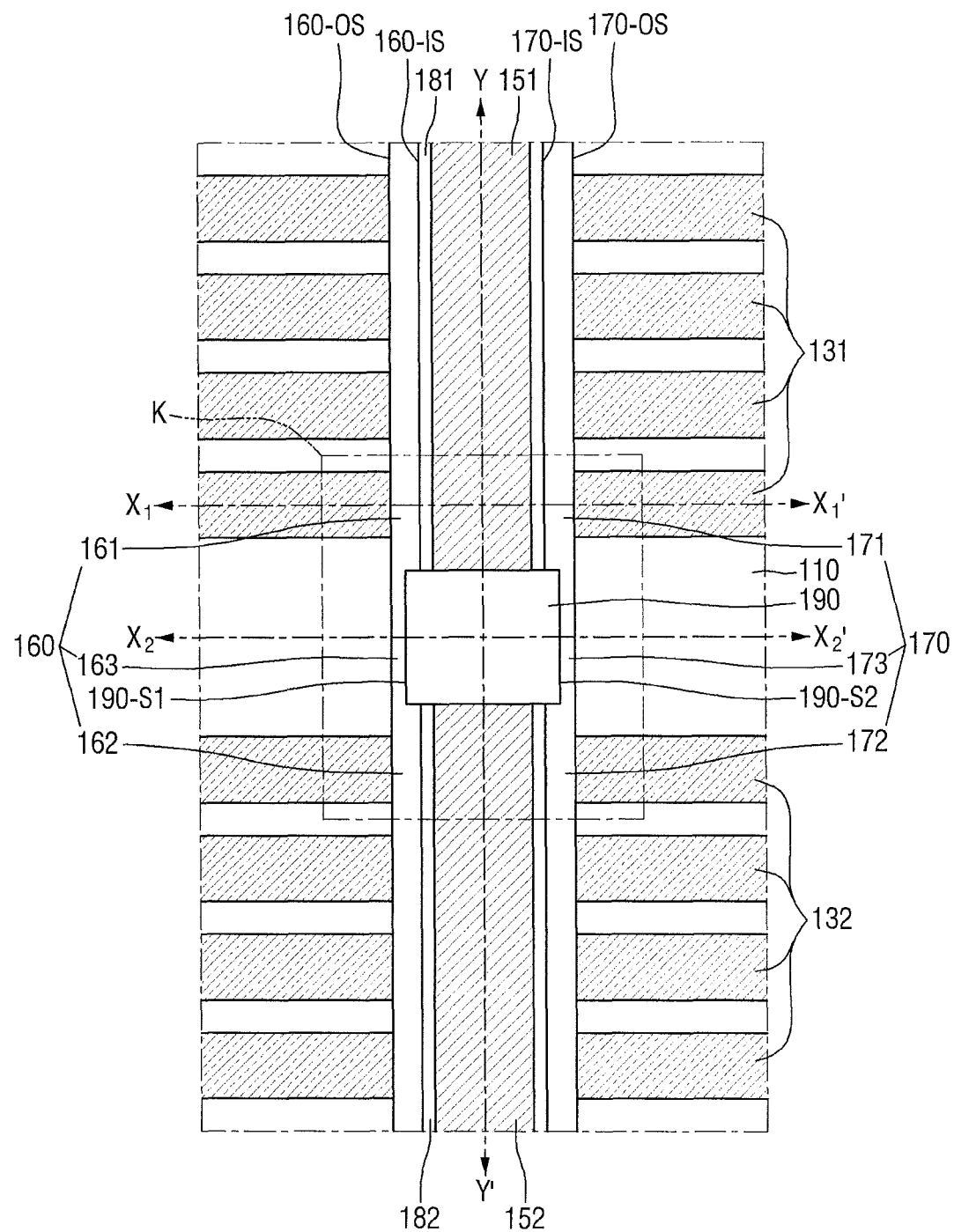
FIG. 2 is a plan view of FIG. 1.
Figure 3:
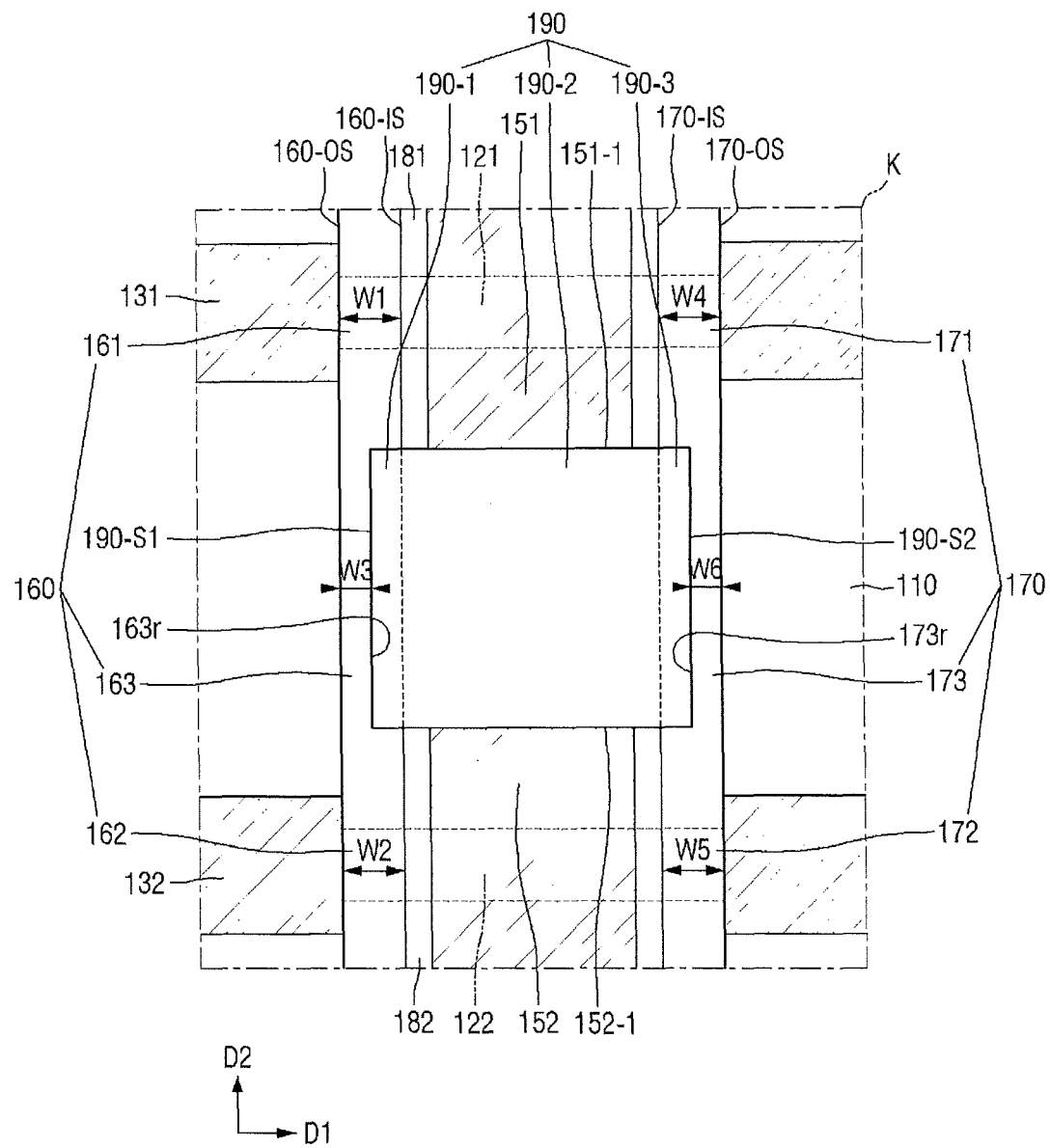
FIG. 3 is an enlarged view of the area K of FIG. 2.
Figure 4:
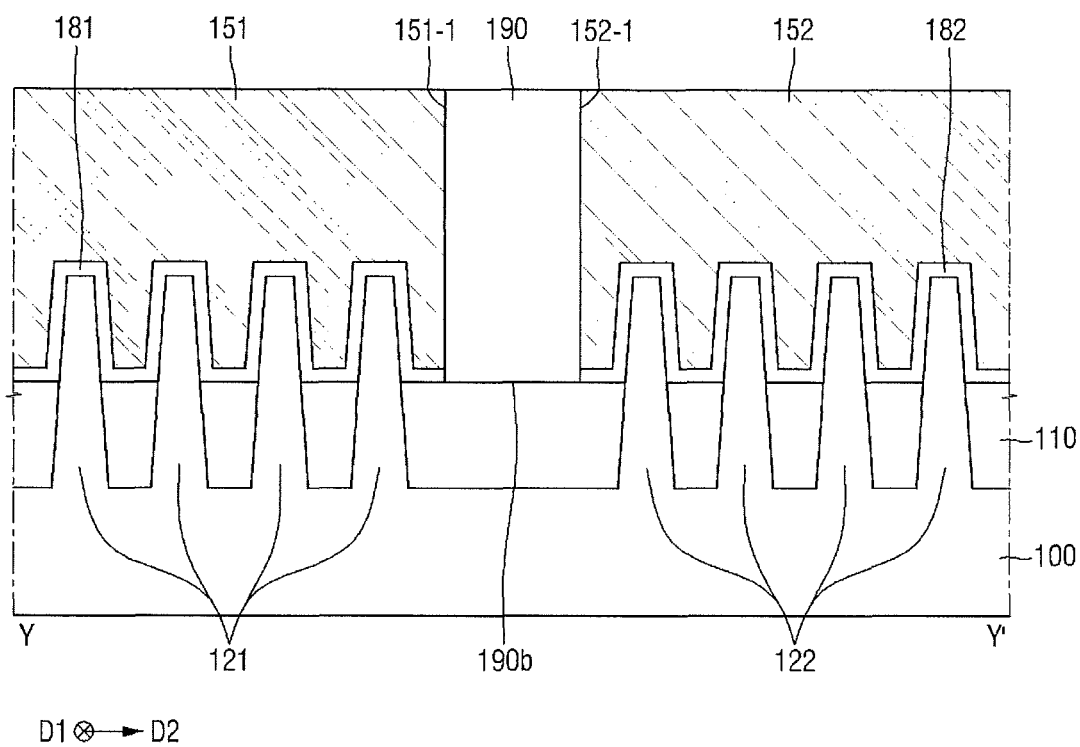
FIG. 4 is a cross-sectional view taken along the line Y-Y' of FIG. 2.
Figure 5:
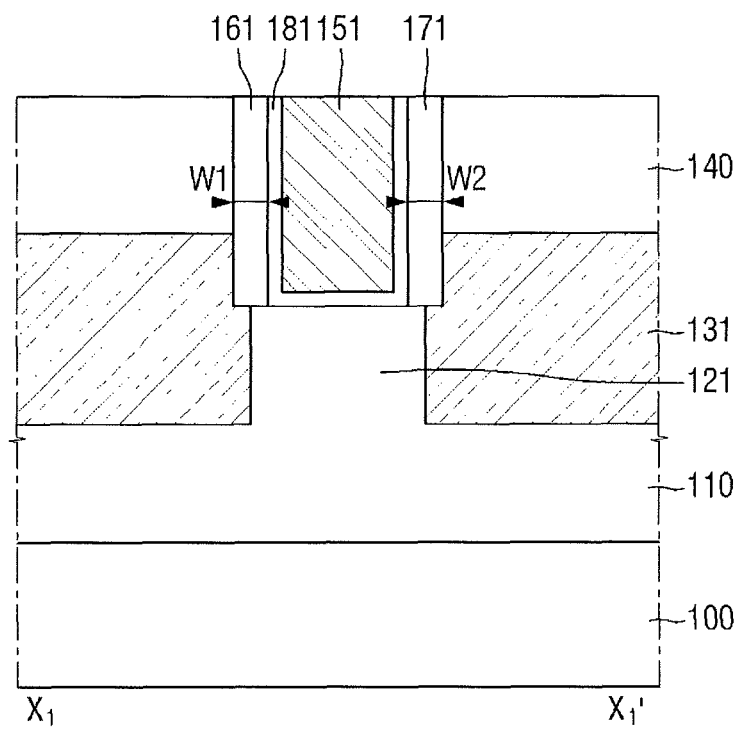
FIG. 5 is a cross-sectional view taken along the line $X_1$-$X_1'$ of FIG. 2.
Figure 6:
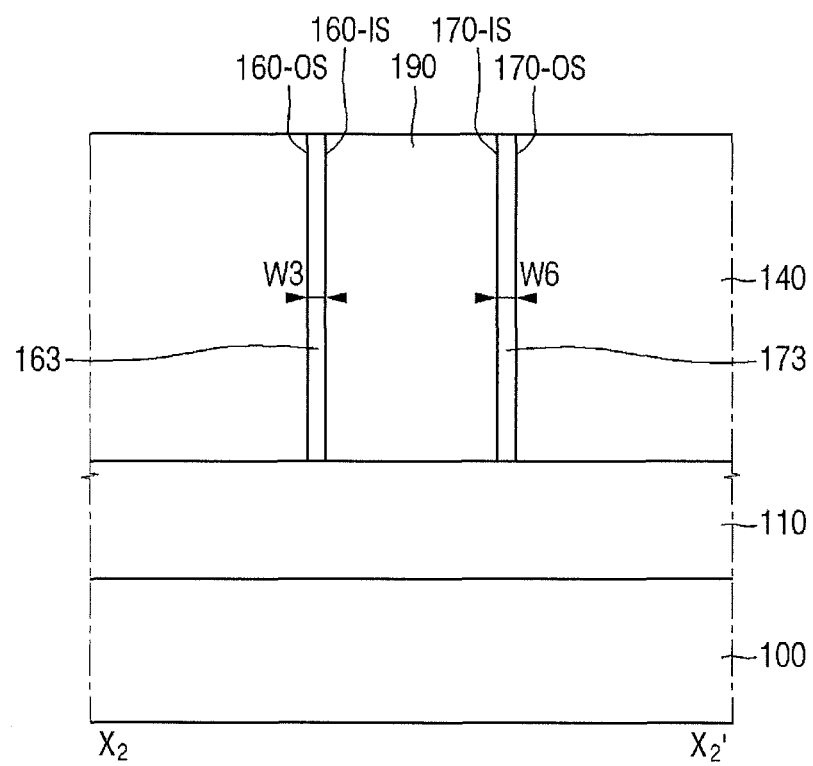
FIG. 6 is a cross-sectional view taken along the line $X_2$-$X_2'$ of FIG. 2.

FIG. 1 is a perspective view of a semiconductor device according to some embodiments of the present inventive concept. FIG. 2 is a plan view of FIG. 1. FIG. 3 is an enlarged view of the area K of FIG. 2. FIG. 4 is a cross-sectional view taken along the line Y-Y' of FIG. 2. FIG. 5 is a cross-sectional view taken along the line $X_1$-$X_1$' of FIG. 2. FIG. 6 is a cross-sectional view taken along the line $X_2$-$X_2$' of FIG. 2.

Referring to FIGS. 1 to 3, the semiconductor device according to some embodiments of the present inventive concept may include a substrate 100, a field insulation film 110, a first gate spacer 160, a second gate spacer 170, and an insulator 190.

The substrate 100 may be made of a bulk silicon or a silicon-on-insulator (SOI). In some embodiments, the substrate 100 may be a silicon substrate or may contain silicon germanium, indium antimonide, lead telluride, indium arsenide, indium phosphide, gallium arsenide, or gallium antimonide. The substrate 100 may be a substrate including a base substrate and an epitaxial layer formed on the base substrate.

A first active fin array 121 and a second active fin array 122 may be disposed on the substrate 100 to extend in a first direction D1. The first active fin array 121 and the second active fin array 122 may be spaced apart from each other in a second direction D2. The second direction D2 may be different from the first direction D1 and may cross the first direction D1. In some embodiments, the second direction D2 may be perpendicular to the first direction D1.

The first active fin array 121 and the second active fin array 122 may protrude from the substrate 100. In some embodiments, the sidewall of each of the first active fin array 121 and the second active fin array 122 may be slanted. However, the present disclosure is not limited thereto. For example, in some embodiments, the sidewall of each of the first active fin array 121 and the second active fin array 122 may be perpendicular to a surface of the substrate 100. Further, for example, each of the first active fin array 121 and the second active fin array 122 may have a tapered shape. Moreover, each of the first active fin array 121 and the second active fin array 122 may have a chamfered shape. In other words, each of the first active fin array 121 and the second active fin array 122 may have a rounded edge.

Each of the first active fin array 121 and the second active fin array 122 may include a plurality of active fins. The plurality of active fins included in each of the first active fin array 121 and the second active fin array 122 may be spaced apart from each other in the second direction D2. In some embodiments, the distance between two adjacent active fins of the plurality of active fins of the first active fin array 121 in the second direction D2 may be shorter than the distance between the first active fin array 121 and the second active fin array 122 in the second direction D2. In some embodiments, the distance between two adjacent active fins of the plurality of active fins of the second active fin array 122 in the second Direction D2 may be shorter than the distance between the first active fin array 121 and the second active fin array 122 in the second Direction D2.

Each of the first active fin array 121 and the second active fin array 122 may contain silicon or germanium, which is an element semiconductor material. Further, each of the first active fin array 121 and the second active fin array 122 may contain a compound semiconductor, such as a group IV-IV compound semiconductor or a group III-V compound semiconductor. For example, the group IV-IV compound semiconductor may be a binary compound semiconductor or ternary compound semiconductor containing two or more of carbon (C), silicon (Si), germanium (Ge) and tin (Sn), or a compound doped with group IV elements. For example, group III-V compound semiconductor may be a binary compound semiconductor, ternary compound semiconductor or quaternary compound semiconductor, which is formed by combining at least one of group III elements, such as aluminum (Al), gallium (Ga) and indium (In) with one of group V elements, such as phosphorus (P), arsenic (As) and antimony (Sb).

The field insulation film 110 may at least partially cover the first active fin array 121 and the second active fin array 122 on the substrate 100. In some embodiments, the field insulation film 110 may entirely cover the sidewalls of the first active fin array 121 and the second active fin array 122 as illustrated in FIG. 1. However, the present disclosure is not limited thereto. For example, in some embodiments, portions of the first active fin array 121 and the second active fin array 122 may protrude from the upper surface of the field insulation film 110, and the field insulation film 110 may expose the sidewalls of the first active fin array 121 and the second active fin array 122.

The field insulation film 110 may be made of a material containing at least one of silicon oxide, silicon nitride, and silicon oxynitride.

An interlayer insulation film 140 may be disposed over the field insulation film 110. The interlayer insulation film 140 may be disposed to cover a first semiconductor pattern 131 and a second semiconductor pattern 132. In FIGS. 1 to 3, for the clarity of illustration, the interlayer insulation film 140 is not shown.

The interlayer insulation film 140 may include at least one of a low dielectric material, an oxide film, a nitride film, and an oxynitride film. Examples of the low dielectric material may include, but are not limited to, FOX (Flowable Oxide), TOSZ (Tonen SilaZen), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD), and combinations thereof.

The first gate spacer 160 and the second gate spacer 170 may be disposed over the substrate 100 to extend in the second direction D2. The first gate spacer 160 and the second gate spacer 170 may be disposed on the first active fin array 121 and the second active fin array 122. In other words, the first gate spacer 160 and the second gate spacer 170 may extend from a region in which the first active fin array 121 is formed on the substrate 100 to a region in which the second active fin array 122 is formed on the substrate 100 via a region that is between the first active fin array 121 and the second active fin array 122.

In some embodiments, each of the first gate spacer 160 and the second gate spacer 170 may be an integrally formed gate spacer. In some embodiments, each of the first gate spacer 160 and the second gate spacer 170 may have a unitary structure as illustrated in FIG. 1.

The first gate spacer 160 and the second gate spacer 170 may be a pair of gate spacers. The first gate spacer 160 and the second gate spacer 170 may be spaced apart from each other in the first direction D1.

The first gate spacer 160 may include an outer sidewall 160-OS and an inner sidewall 160-IS that is opposite the outer sidewall 160-OS. In some embodiments, the outer sidewall 160-OS of the first gate spacer 160 may be in contact with the interlayer insulation film 140. In some embodiments, the inner sidewall 160-IS of the first gate spacer 160 may be in contact with gate insulation films 181 and 182 and an insulator 190.

The first gate spacer 160 may include a first region 161, a second region 162, and a third region 163.

The first region 161 of the first gate spacer 160 may be a region disposed on the first active fin array 121. The first region 161 of the first gate spacer 160 may have a first width W1. The first width W1 may be a value obtained by measuring the first region 161 of the first gate spacer 160, the first region 161 overlapping the first active fin array 121. However, it will be understood that the present disclosure is not limited thereto. For example, the first width W1 may be a value obtained by measuring the first region 161 of the first gate spacer 160, the first region 161 being adjacent to the first semiconductor pattern 131. The first width W1 may be a value measured along the first direction D1.

The second region 162 of the first gate spacer 160 may be a region disposed on the second active fin array 122. The second region 162 of the first gate spacer 160 may have a second width W2. The second width W2 may be a value obtained by measuring the second region 162 of the first gate spacer 160, the second region 162 overlapping the second active fin array 122. However, the present disclosure is not limited thereto. For example, the second width W2 may be a value obtained by measuring the second region 162 of the first gate spacer 160, the second region 162 being adjacent to the second semiconductor pattern 132. The second width W2 may be a value measured along the first direction D1.

The third region 163 of the first gate spacer 160 may be a region disposed between the first region 161 and the second region 162. The third region 163 of the first gate spacer 160 may be a region disposed over a region between the first active fin array 121 and the second active fin array 122. In other words, the third region 163 may not overlap the first active fin array 121 and the second active fin array 122. The third region 163 may include a first recess 163r. The first recess 163r may expose a part of the first region 161 and a part of the second region 162. A detailed description thereof will be described later.

The third region 163 of the first gate spacer 160 may have a third width W3. The third width W3 may be a value obtained by measuring the third region 163 of the first gate spacer 160, the third region 163 being provided with the first recess 163r. The third width W3 may be a value measured along the first direction D1.

The second gate spacer 170 may include an outer sidewall 170-OS and an inner sidewall 170-IS which face each other. The outer sidewall 170-OS of the second gate spacer 170 may be in contact with the interlayer insulation film 140. The inner sidewall 170-IS of the second gate spacer 170 may be in contact with the gate insulation films 181 and 182 and the insulator 190. A detailed description thereof will be described later.

The second gate spacer 170 may include a fourth region 171, a fifth region 172, and a sixth region 173.

The fourth region 171 of the second gate spacer 170 may be a region disposed on the first active fin array 121. The fourth region 171 of the second gate spacer 170 may have a fourth width W4. The fourth width W4 may be a value obtained by measuring the fourth region 171 of the second gate spacer 170, the fourth region 171 overlapping the first active fin array 121. However, the present disclosure is not limited thereto. For example, the fourth width W4 may be a value obtained by measuring the fourth region 171 of the second gate spacer 170, the fourth region 171 being adjacent to the first semiconductor pattern 131. The fourth width W4 may be a value measured along the first direction D1.

The fifth region 172 of the second gate spacer 170 may be a region disposed on the second active fin array 122. The fifth region 172 of the second gate spacer 170 may have a fifth width W5. The fifth width W5 may be a value obtained by measuring the fifth region 172 of the second gate spacer 170, the fifth region 172 overlapping the second active fin array 122. However, the present disclosure is not limited thereto. For example, the fifth width W5 may be a value obtained by measuring the fifth region 172 of the second gate spacer 170, the fifth region 172 being adjacent to the second semiconductor pattern 132. The fifth width W5 may be a value measured along the first direction D1.

The sixth region 173 of the second gate spacer 170 may be a region disposed between the fourth region 171 and the fifth region 172. The sixth region 173 of the second gate spacer 170 may be a region disposed over a region between the first active fin array 121 and the second active fin array 122. In other words, the sixth region 173 may not overlap the first active fin array 121 and the second active fin array 122.

The sixth region 173 may include a second recess 173r. The second recess 173r may expose a part of the fourth region 171 and a part of the fifth region 172. A detailed description thereof will be described later.

The sixth region 173 of the second gate spacer 170 may have a sixth width W6. The sixth width W6 may be a value obtained by measuring the sixth region 173 of the second gate spacer 170, the sixth region 173 being provided with the second recess 173r. The sixth width W6 may be a value measured along the first direction D1.

According to the formation of the first recess 163r and the second recess 173r, the width W3 of the third region 163 of the first gate spacer 160 and the width W6 of the sixth region 173 of the second gate spacer 170 may be reduced. In other words, the first width W1, the second width W2, the fourth width W4, and the fifth width W5 may be greater than the third width W3 and the sixth width W6.

In the semiconductor device according to some embodiments of the present inventive concept, the first recess 163r and the second recess 173r are included in the first gate spacer 160 and the second gate spacer 170, respectively, and thus the widths of regions of the first and second gate spacers 160 and 170 may be different from each other.

As illustrated in the figures each of the first and second gate spacers 160 and 170 has a single layer structure. However, it will be understood that embodiments of the present inventive concept are not limited thereto. For example, each of the first and second gate spacers 160 and 170 may have a multi-layer structure.

Each of the first and second gate spacers 160 and 170 may contain one of silicon nitride (SiN), silicon oxynitride (SiON), silicon oxide ($SiO_2$), silicon carbooxynitride (SiOCN), silicon carbonitride (SiCN), and combinations thereof.

The first and second gate spacers 160 and 170 may be spaced apart from each other in the second direction D2. Each of first and second gate spacers 160 and 170 may extend in the second direction D2.

A first gate electrode 151 may be disposed on the first active fin array 121. In other words, one part of the first gate electrode 151 may be disposed to overlap the first active fin array 121. Another part of the first gate electrode 151 may be disposed on the field insulation film 110. Conversely, the first gate electrode 151 may not overlap the second active fin array 122.

The first gate electrode 151 may be disposed between the inner sidewall 160-IS of the first gate spacer 160 and the inner sidewall 170-IS of the second gate spacer 170. In particular, the first gate electrode 151 may be disposed between the first region 161 of the first gate spacer 160 and the fourth region 171 of the second gate spacer 170. In other words, the first region 161 of the first gate spacer 160 may be disposed on the one sidewall of the first gate electrode 151. Further, the fourth region 171 of the second gate spacer 170 may be disposed on the other sidewall of the first gate electrode 151.

The first gate electrode 151 may include a first surface 151-1 connecting both sidewalls of the first gate electrode 151. The first surface 151-1 of the first gate electrode 151 may be a surface facing a second gate electrode 152.

The second gate electrode 152 may be disposed on the second active fin array 122. In other words, a part of the second gate electrode 152 may be disposed to overlap the second active fin array 122. Another part of the second gate electrode 152 may be disposed on the field insulation film 110. Conversely, the second gate electrode 152 may not overlap the first active fin array 121.

The second gate electrode 152 may be disposed between the inner sidewall 160-IS of the first gate spacer 160 and the inner sidewall 170-IS of the second gate spacer 170. In particular, the second gate electrode 152 may be disposed between the second region 162 of the first gate spacer 160 and the fifth region 172 of the second gate spacer 170. In other words, the second region 162 of the first gate spacer 160 may be disposed on the one sidewall of the second gate electrode 152. Further, the fifth region 172 of the second gate spacer 170 may be disposed on the other sidewall of the second gate electrode 152.

The second gate electrode 152 may include a second surface 152-1 connecting both sidewalls of the second gate electrode 152. The second surface 152-1 of the second gate electrode 152 may be a surface facing the first surface 151-1 of the first gate electrode 151.

As illustrated in the figures each of the first and second gate electrodes 151 and 152 has a single layer structure. However, embodiments of the present inventive concept are not limited thereto. For example, each of the first and second gate electrodes 151 and 152 may have a multi-layer structure in which two or more metal layers are laminated. In other words, each of the first and second gate electrodes 151 and 152, for example, may include a work function adjusting metal layer and a metal layer filling the space formed by the work function adjusting metal layer.

Each of the first and second gate electrodes 151 and 152 may contain a conductive material. Examples of the conductive material may include, but are not limited to, doped polysilicon, titanium nitride (TiN), tantalum nitride (TaN), tungsten nitride (WN), titanium (Ti), tantalum (Ta), and tungsten (W).

The first semiconductor pattern 131 may be disposed on the upper surface of the first active fin array 121, the sidewall of the first region 161 of the first gate spacer 160, and the sidewall of the fourth region 171 of the second gate spacer 170. For example, the first semiconductor pattern 131 may be in contact with the outer sidewall 160-OS of the first gate spacer 160 and the outer sidewall 170-OS of the second gate spacer 170.

The second semiconductor pattern 132 may be disposed on the upper surface of the second active fin array 122, the sidewall of the second region 162 of the first gate spacer 160, and the sidewall of the fifth region 172 of the second gate spacer 170. For example, the second semiconductor pattern 132 may be in contact with the outer sidewall 160-OS of the first gate spacer 160 and the outer sidewall 170-OS of the second gate spacer 170.

Each of the first semiconductor pattern 131 and the second semiconductor pattern 132 has at least one of a diamond shape, a circular shape, and rectangular shape. A diamond shape (a pentagonal or hexagonal shape) is illustrated in FIG. 1, however, embodiments of the present inventive concept are not limited thereto.

The first semiconductor pattern 131 may be source/drain of a transistor composed of the first active fin 121 and the first gate electrode 151, for example, elevated source/drain. The second semiconductor pattern 132 may be source/drain of a transistor composed of the second active fin 122 and the second gate electrode 152, for example, elevated source/drain.

When the transistor formed using the first active fin array 121 and the second active fin array 122 is a PMOS transistor, each of the first semiconductor pattern 131 and the second semiconductor pattern 132 may contain a compressive stress material. The compressive stress material may be a material having a higher lattice constant than silicon (Si). For example, the compressive stress material may be SiGe. The compressive stress material applies compressive stress to the first active fin array 121 and the second active fin array 122, so as to improve the mobility of carriers in a channel region.

When the transistor formed using the first active fin array 121 and the second active fin array 122 is a NMOS transistor, each of the first semiconductor pattern 131 and the second semiconductor pattern 132 may contain a material the same as that of the substrate 100 or may contain a tensile stress material. For example, when the substrate 100 contains silicon (Si), each of the first semiconductor pattern 131 and the second semiconductor pattern 132 may contain silicon (Si) or may contain a material having a lower lattice constant than silicon (Si) (for example, SiC).

The first gate insulation film 181 may be disposed on the bottom surface and sidewall of the first gate electrode 151. A part of the first gate insulation film 181 may be disposed between the first gate electrode 151 and the first region 161 of the first gate spacer 160 and between the first gate electrode 151 and the fourth region 171 of the second gate spacer 170.

In other words, the first gate insulation film 181 may be disposed on the sidewall of the first region 161 of the first gate spacer 160 and the sidewall of the fourth region 171 of the second age spacer 170. The first gate insulation film 181 may be in contact with a part of the inner sidewall 160-IS of the first gate spacer 160 and a part of the inner sidewall 170-IS of the second gate spacer 170.

Further, other part of the first gate insulation film 181 may be disposed between the first gate electrode 151 and the field insulation film 110 and between the first gate electrode 151 and the first active fin array 121. Details thereof will be described later.

The first gate insulation film 181 may not be disposed between the first gate electrode 151 and the insulator 190, between the third region 163 of the first gate spacer 160 and the insulator 190, and between the sixth region 173 of the second gate spacer 170 and the insulator 190.

The second gate insulation film 182 may be disposed on the bottom surface and sidewall of the second gate electrode 152. A part of the second gate insulation film 182 may be disposed between the second gate electrode 152 and the second region 162 of the first gate spacer 160 and between the second gate electrode 152 and the fifth region 172 of the second gate spacer 170.

In other words, the second gate insulation film 182 may be disposed on the sidewall of the second region 162 of the first gate spacer 160 and the sidewall of the fifth region 172 of the second age spacer 170. The second gate insulation film 182 may be in contact with other part of the inner sidewall 160-IS of the first gate spacer 160 and other part of the inner sidewall 170-IS of the second gate spacer 170.

Further, other part of the second gate insulation film 182 may be disposed between the second gate electrode 152 and the field insulation film 110 and between the second gate electrode 152 and the second active fin array 122. Details thereof will be discussed further below.

The second gate insulation film 182 may not be disposed between the second gate electrode 152 and the insulator 190, between the third region 163 of the first gate spacer 160 and the insulator 190, and between the sixth region 173 of the second gate spacer 170 and the insulator 190.

As illustrated in the figures each of the first and second gate insulation films 181 and 182 has a single layer structure. However, the present disclosure is not limited thereto. For example, each of the first and second gate insulation films 181 and 182 may have a multi-layer structure including one or more high dielectric insulation films.

For example, each of the first and second gate insulation films 181 and 182 may contain one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide), and lead zinc niobate. However, embodiments of the present inventive concept are not limited thereto.

The semiconductor device according to some embodiments of the present inventive concept may include an insulator 190 disposed between the third region 163 of the first gate spacer 160 and the sixth region of the second gate spacer 170.

In some embodiments, a part of the insulator 190 may be directly in contact with the third region 163 of the first gate spacer 160 and the sixth region 173 of the second gate spacer 170.

In other words, the third region 163 of the first gate spacer 160 may be disposed on one sidewall 190-S1 of the insulator 190, and the sixth region 173 of the second gate spacer 170 may be disposed on the other sidewall 190-S2 of the insulator 190.

In these embodiments, the one sidewall 190-S1 of the insulator 190 may be a portion being in contact with the inner sidewall 160-IS of the first gate spacer 160. Further, the other sidewall 190-S2 of the insulator 190 may be a portion being in contact with the inner sidewall 170-IS of the second gate spacer 170.

The insulator 190 may be disposed between the first gate electrode 151 and the second gate electrode 152. In other words, the insulator may not overlap the first and second active fin arrays 121 and 122.

Another part of the insulator 190 may be in contact with the first and second gate electrodes 151 and 152. In some embodiments, still another part of the insulator 190 may be in contact with the first surface 151-1 of the first gate electrode 151 and the second surface 152-1 of the second gate electrode 152.

The insulator 190 may include a first portion 190-1, a second portion 190-2, and a third portion 190-3. The second portion 190-2 of the insulator 190 may be a portion disposed between the first portion 190-1 and the third portion 190-3.

The first portion 190-1, the second portion 190-2, and the third portion 190-3 may be disposed in the first direction D1.

The first portion 190-1 of the insulator 190 may be disposed in the first recess 163r formed in the inner sidewall 160-IS of the first gate spacer 160. In other words, the first portion 190-1 of the insulator 190 may be a portion of the insulator 190 inserted in the first recess 163r.

Since the first portion 190-1 of the insulator 190 is inserted into the first recess 163r, the first portion 190-1 of the insulator 190 may be a portion disposed between the first region 161 of the first gate spacer 160 and the second region 162 of the first gate spacer 160.

The second portion 190-2 of the insulator 190 may be a portion disposed between the first gate electrode 151 and the second gate electrode 152. The second portion 190-2 of the insulator may be in contact with the first and second gate insulation films 181 and 182, the first surface 151-1 of the first gate electrode 151, and the second surface 152-1 of the second gate electrode 152.

The third portion 190-3 of the insulator 190 may be disposed in the second recess 173r formed in the inner sidewall 170-IS of the second gate spacer 170. In other words, the third portion 190-3 of the insulator 190 may be another portion of the insulator 190 inserted in the second recess 173r. Since the third portion 190-3 of the insulator 190 is inserted into the second recess 173r, the third portion 190-3 of the insulator 190 may be a portion disposed between the fourth region 171 of the second gate spacer 170 and the fifth region 172 of the second gate spacer 170.

As illustrated in the figures, the insulator 190 has a rectangular pillar shape. However, the present disclosure is not limited thereto. For example, the insulator 190 may also have an approximately polygonal or cylindrical shape.

The insulator 190 may contain a material having an etching selectivity to Si and $SiO_2$.

The insulator 190 is disposed between the first gate spacer 160 and the second gate spacer 170, which are integrally formed, and between the first gate electrode 151 and the second gate electrode 152, thereby performing a function of separating the nodes of the gate electrodes.

Referring to FIGS. 1, 2 and 4, the bottom surface 190b of the insulator 190 may be in contact with the field insulation film 110.

The first and second gate insulation films 181 and 182 may not be disposed between the field insulation film 110 and the insulator 190. Further, the first and second gate insulation films 181 and 182 may not be disposed between the insulator 190 and the first surface 151-1 of the first gate electrode 151 and between the insulator 190 and the second surface 152-1 of the second gate electrode 152.

As illustrated in the figures, the top surfaces of the first gate electrode 151, the second gate electrode 152, and the insulator 190 are arranged in a straight line. However, the present disclosure is not limited thereto. For example, according to processes, the top surfaces of the first gate electrode 151, the second gate electrode 152, and the insulator 190 may also be arranged to have different heights from each other.

Referring to FIGS. 1, 2 and 5, the insulator 190 may not disposed on the first active fin array 121.

As illustrated in the figures a part of the first region 161 of the first gate spacer 160 and the first active fin array 121 overlap each other in a direction perpendicular to the top surface of the substrate 100. However, the present disclosure is not limited thereto. For example, according to processes, the entire first region 161 of the first gate spacer 160 may also overlap the first active fin array fin 121.

An interfacial film may be disposed between the first gate insulation film 181 and the first active fin array 121. The interfacial film may not extend along the top surface of the field insulation film 110. The interfacial film may not be disposed between the first gate insulation film 181 and the first region 161 of the first gate spacer 160 and between the first gate insulation film 181 and the fourth region 171 of the second gate spacer 170.

The interfacial film may contain silicon oxide, but it will be understood that the present disclosure is not limited thereto.

Referring to FIGS. 1, 2 and 6, the third region 163 of the first gate spacer 160 and the sixth region 173 of the second gate spacer 170 may be in contact with the insulator 190 and the interlayer insulation film 140, respectively.

Hereinafter, a semiconductor device according to some embodiments of the present inventive concept will be described with reference to FIGS. 2, 4, 5, 7 to 9. For the purpose of clarity of explanation, the aforementioned redundant descriptions will be omitted.

Figure 7:
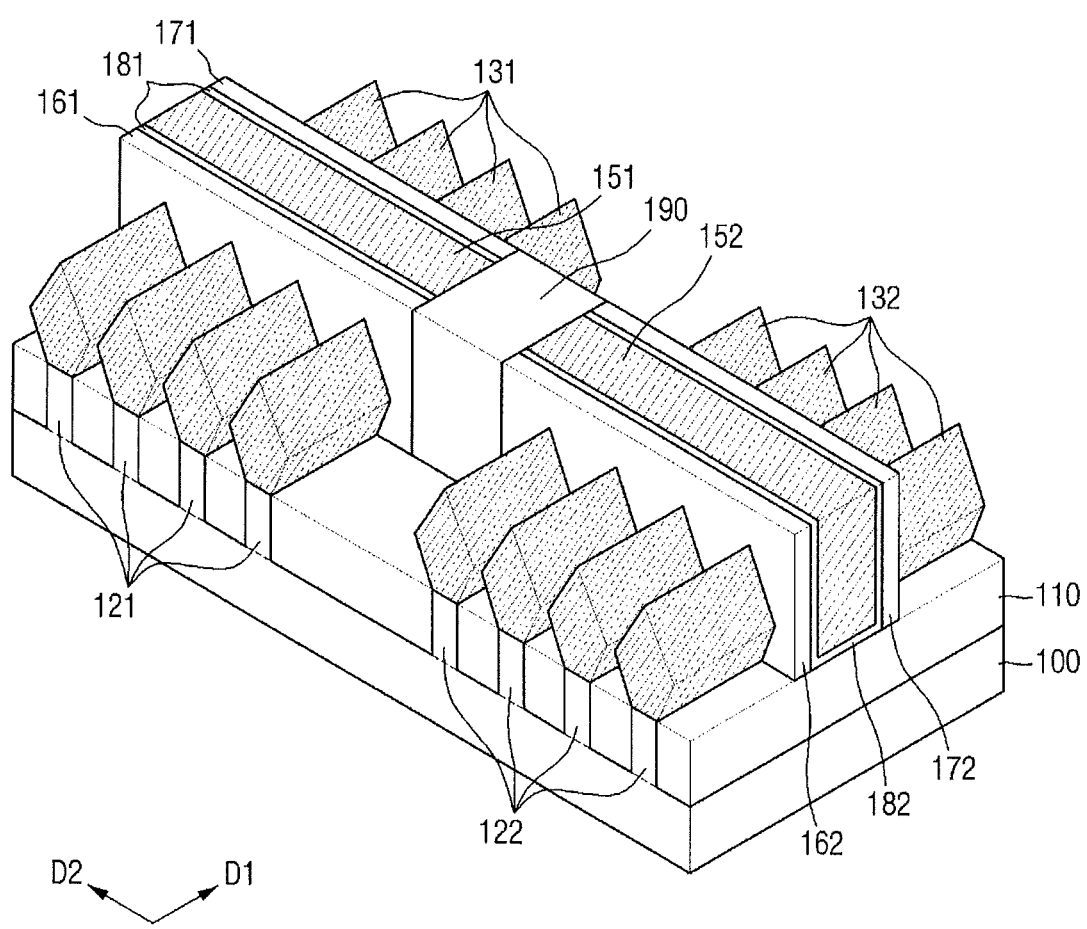
FIG. 7 is a perspective view of a semiconductor device according to some embodiments of the present inventive concept.
Figure 8:
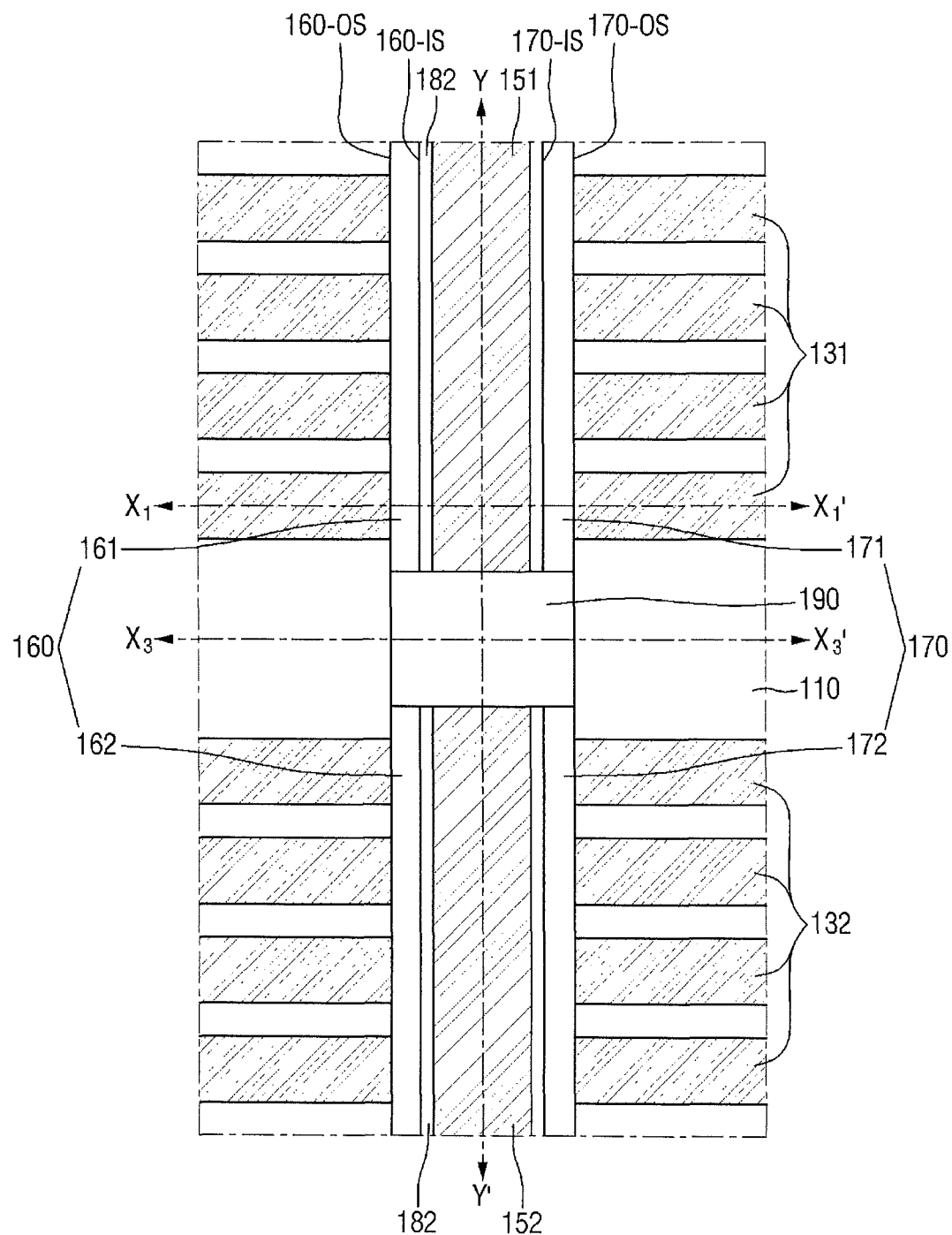
FIG. 8 is a plan view of FIG. 7.
Figure 9:
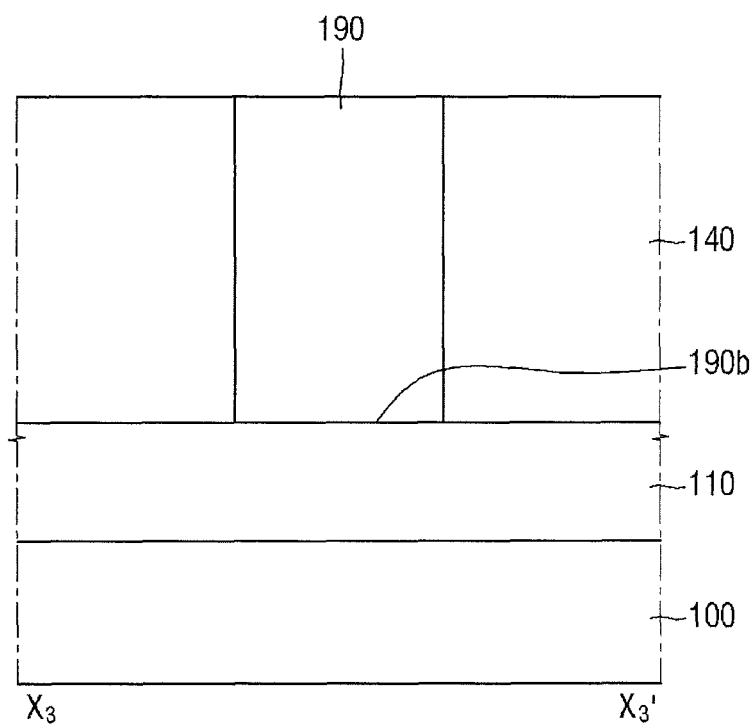
FIG. 9 is a cross-sectional view taken along the line $X_3$-$X_3'$ of FIG. 8.

FIG. 7 is a perspective view of a semiconductor device according to some embodiments of the present inventive concept. FIG. 8 is a plan view of FIG. 7. FIG. 9 is a cross-sectional view taken along the line $X_3$-$X_3$' of FIG. 8.

Referring to FIGS. 2, 4, 5, 7 to 9, both sidewall 190-S1 and 190-S2 of the insulator 190 may be directly in contact with the interlayer insulation film 140.

A part of the insulator 190 may be disposed between the first region 161 of the first gate spacer 160 and the second region 162 of the first gate spacer 150 and between the fourth region 171 of the second gate spacer 170 and the fifth region 172 of the second gate spacer 170.

However, when compared with FIG. 2, the third region 163 of the first gate spacer 160 and the sixth region 173 of the second gate spacer 170 may not be disposed. Therefore, both sidewall 190-S1 and 190-S2 of the insulator 190 may be directly in contact with the interlayer insulation film 140.

The width of the insulator 190 of FIGS. 7 to 9 may be greater than the width of the insulator 190 of FIG. 2. In these embodiments, the width of the insulator 190 may be a value measured from the one sidewall 190-S1 thereof to the other sidewall 190-S2 thereof along the first direction D1.

In some embodiment, the width of the insulator 190 may be substantially equal to the width from the outer sidewall 160-OS from the first gate spacer 160 to the outer sidewall 170-OS from the second gate spacer 170. However, the present disclosure is not limited thereto. For example, the width of the insulator 190 may also be greater than the width from the outer sidewall 160-OS from the first gate spacer 160 to the outer sidewall 170-OS from the second gate spacer 170.

The cross-sectional view taken along the line Y-Y' of FIG. 8 may be the same as FIG. 4. The cross-sectional view taken along the line $X_1$-$X_1$' of FIG. 8 may be the same as FIG. 5.

Hereinafter, a semiconductor device according to some embodiments of the present inventive concept will be described with reference to FIGS. 2, 4, 5, 10 to 12. For the purpose of clarity of explanation, the aforementioned redundant descriptions will be omitted.

Figure 10:
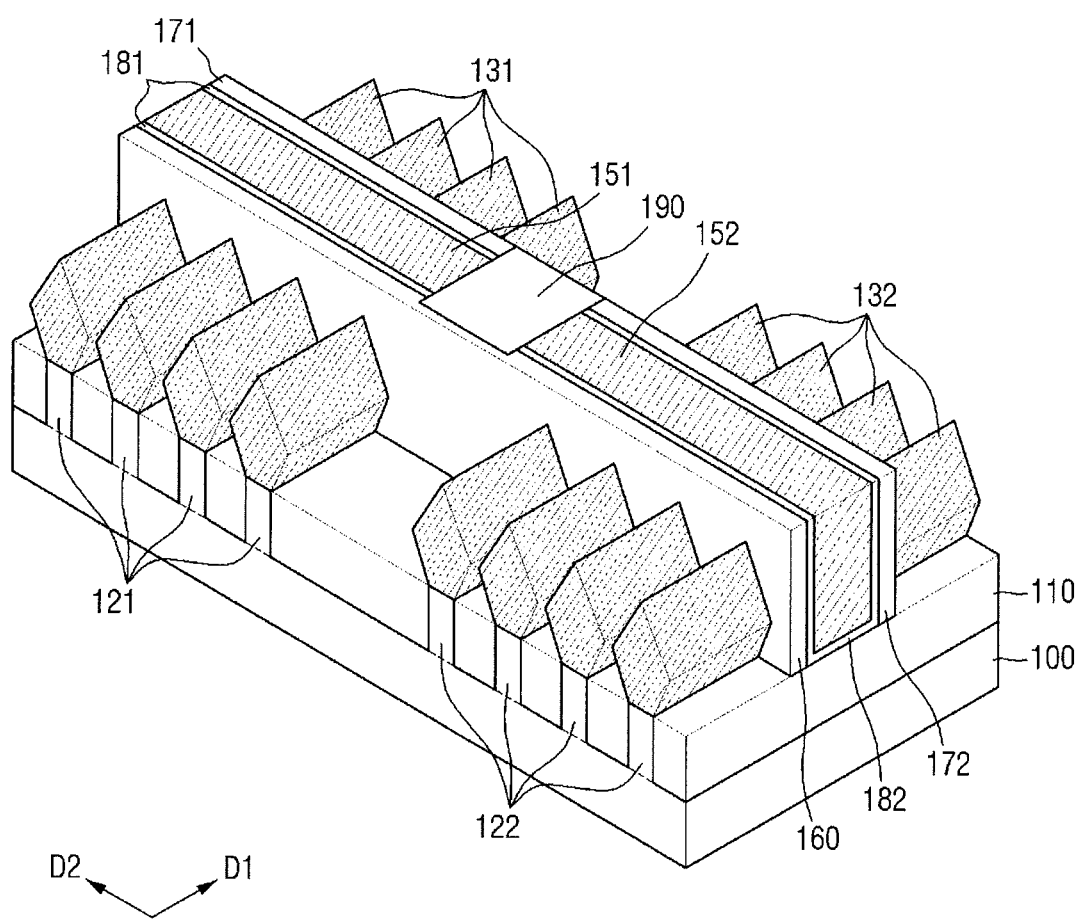
FIG. 10 is a perspective view of a semiconductor device according to some embodiments of the present inventive concept.
Figure 11:
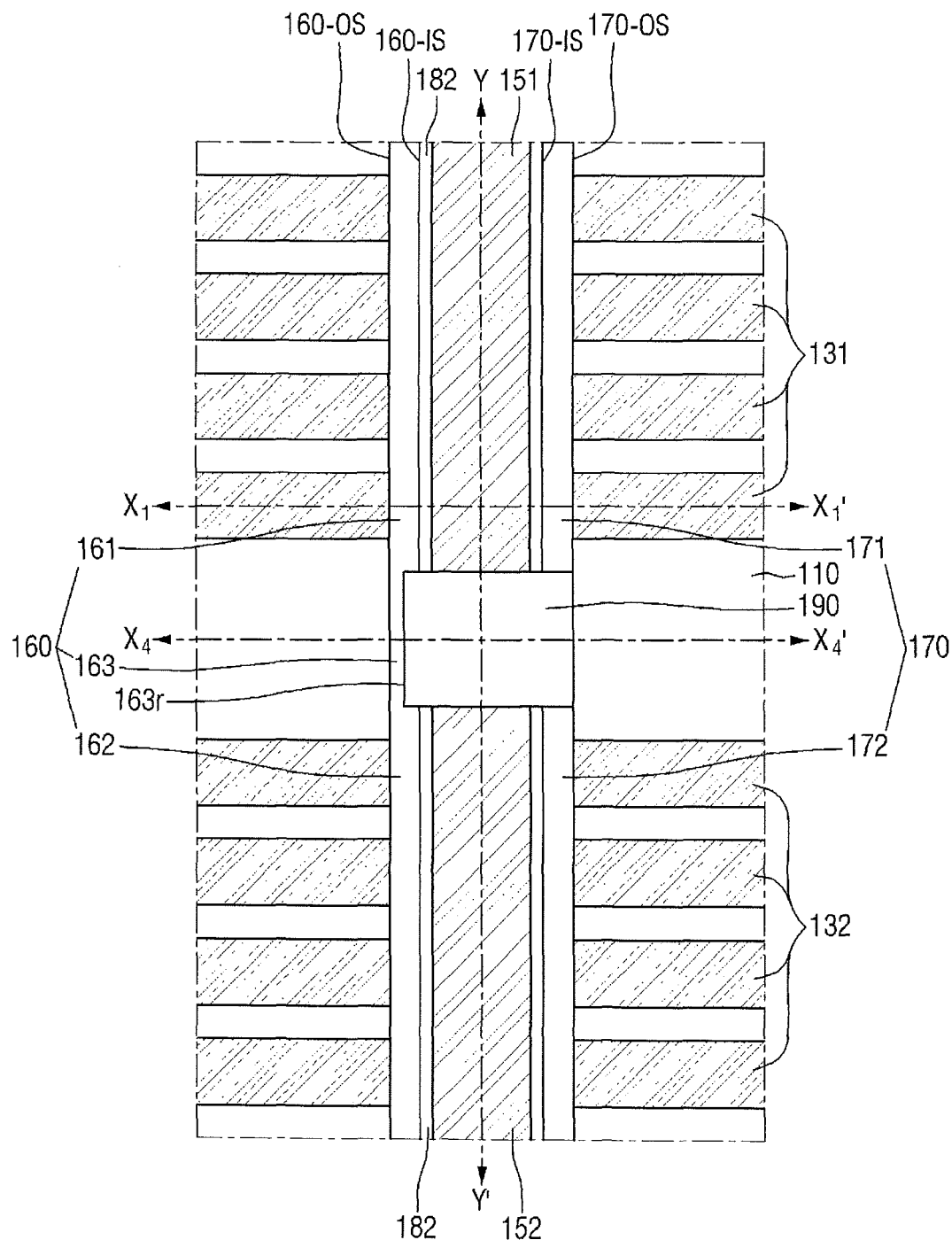
FIG. 11 is a plan view of FIG. 10.
Figure 12:
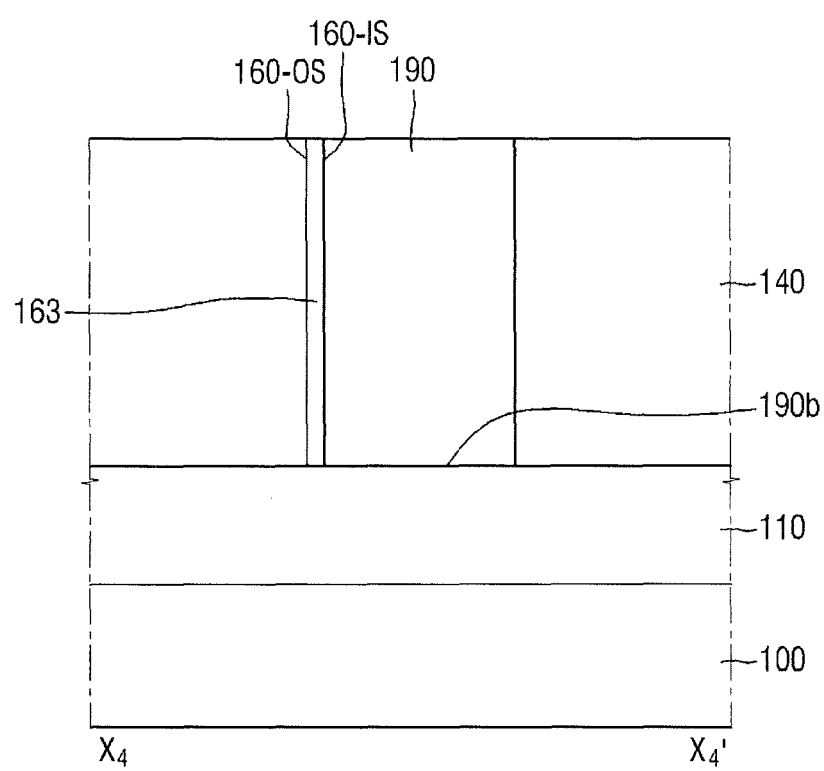
FIG. 12 is a cross-sectional view taken along the line $X_4$-$X_4'$ of FIG. 11.

FIG. 10 is a perspective view of a semiconductor device according to some embodiments of the present inventive concept. FIG. 11 is a plan view of FIG. 10. FIG. 12 is a cross-sectional view taken along the line $X_4$-$X_4$' of FIG. 11.

Referring to FIGS. 2, 4, 5, 10 to 12, one sidewall 190-S1 of the insulator 190 may be in contact with the third region 163 of the first gate spacer 160, and the other sidewall 190-S2 of the insulator 190 may be directly in contact with the interlayer insulation film 140.

In some embodiments, the sixth region 173 of the second gate spacer 170 may not be disposed. Therefore, only one sidewall (for example, the other sidewall 190-S2 of the insulator 190) may be directly in contact with the interlayer insulation film 140.

The width of the insulator 190 may be smaller than the width from the outer sidewall 160-OS from the first gate spacer 160 to the outer sidewall 170-OS from the second gate spacer 170.

The cross-sectional view taken along the line Y-Y' of FIG. 11 may be the same as FIG. 4. The cross-sectional view taken along the line $X_1$-$X_1'$ of FIG. 11 may be the same as FIG. 5.

Hereinafter, a semiconductor device according to some embodiments of the present inventive concept will be described with reference to FIGS. 13 to 16. For the purpose of clarity of explanation, the aforementioned redundant descriptions will be omitted.

Figure 13:
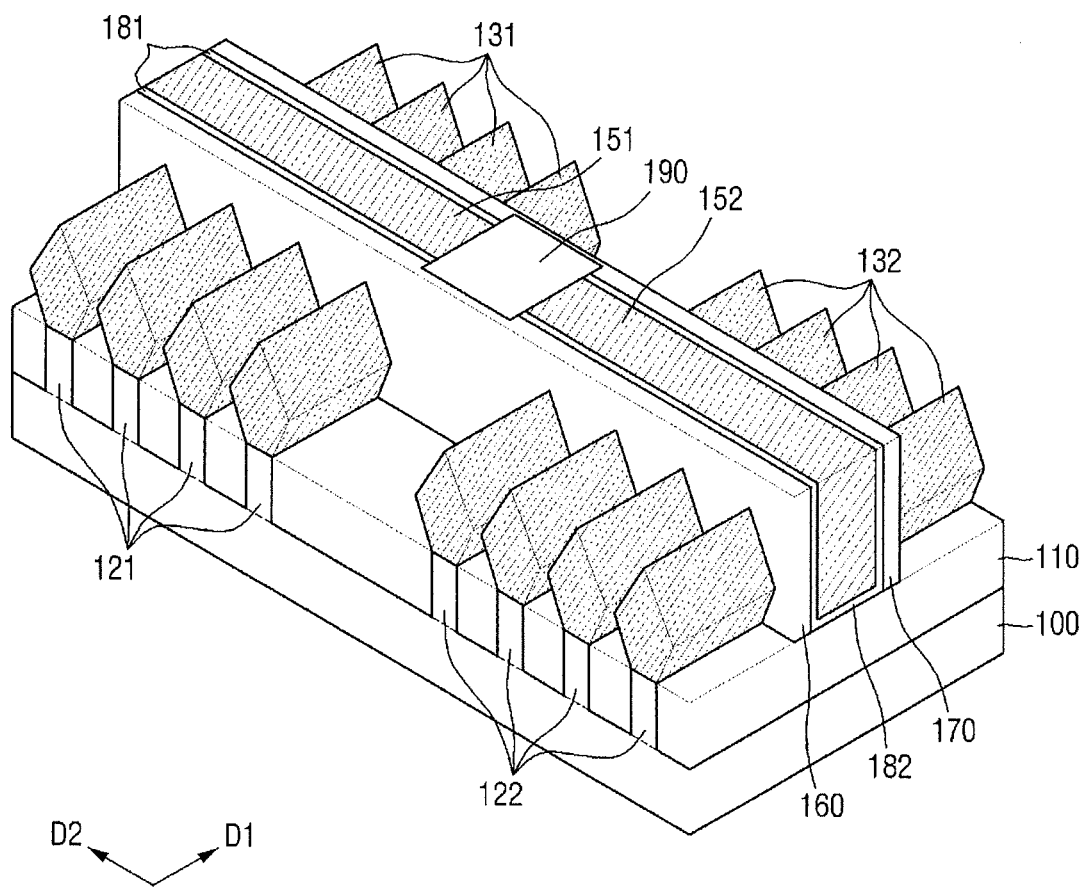
FIG. 13 is a perspective view of a semiconductor device according to some embodiments of the present inventive concept.
Figure 14:
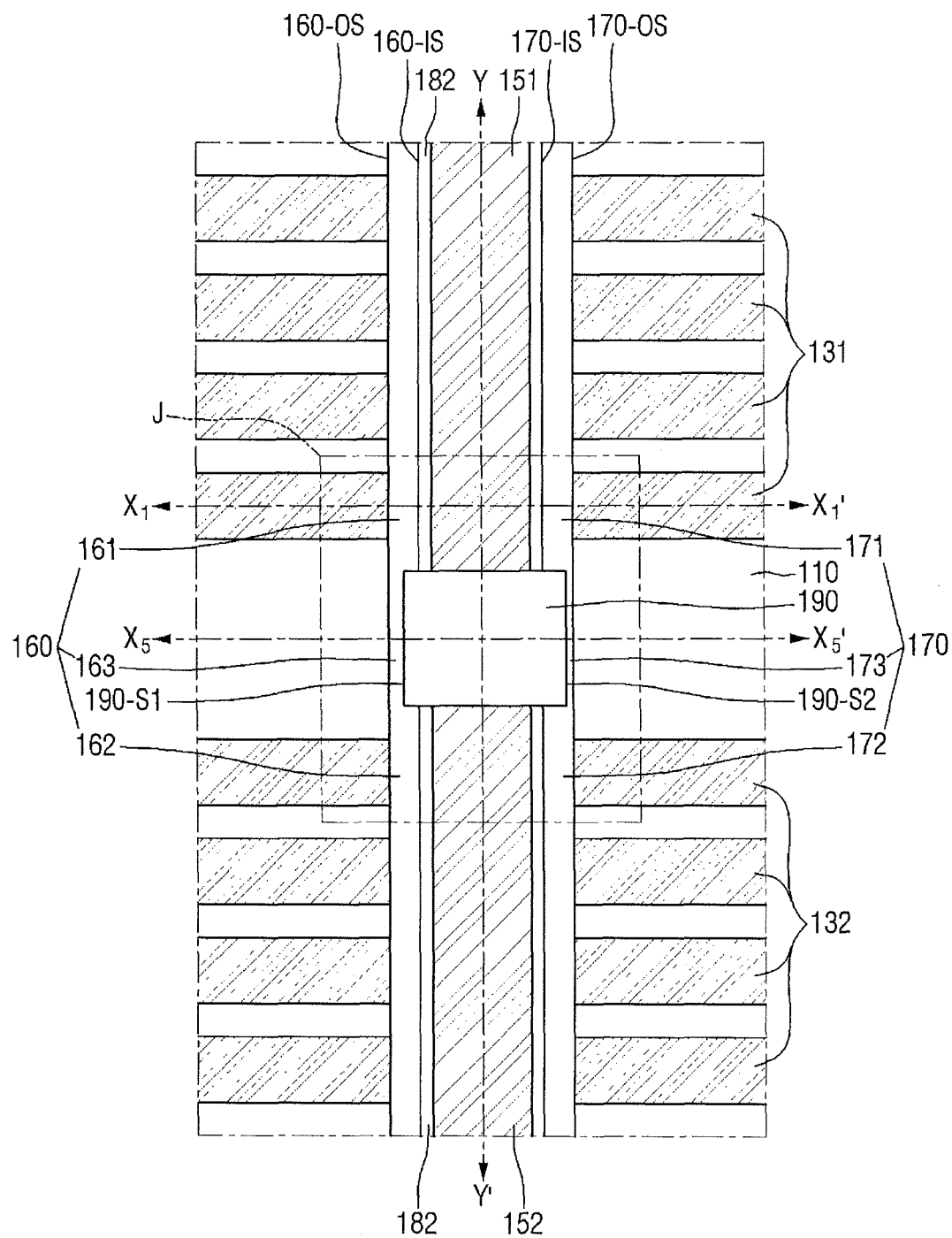
FIG. 14 is a plan view of FIG. 13.
Figure 15:
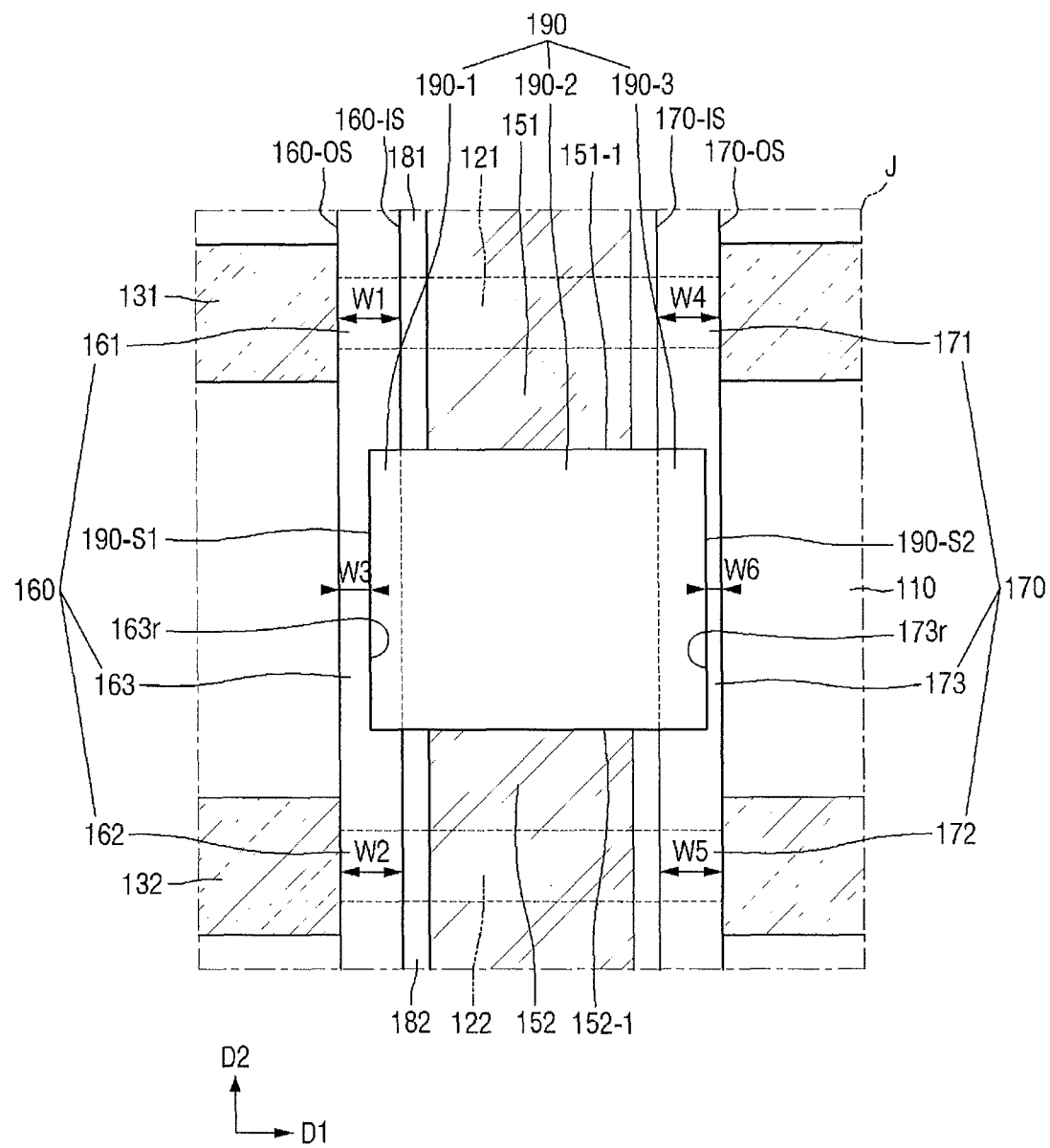
FIG. 15 is an enlarged view of the area J of FIG. 14.
Figure 16:
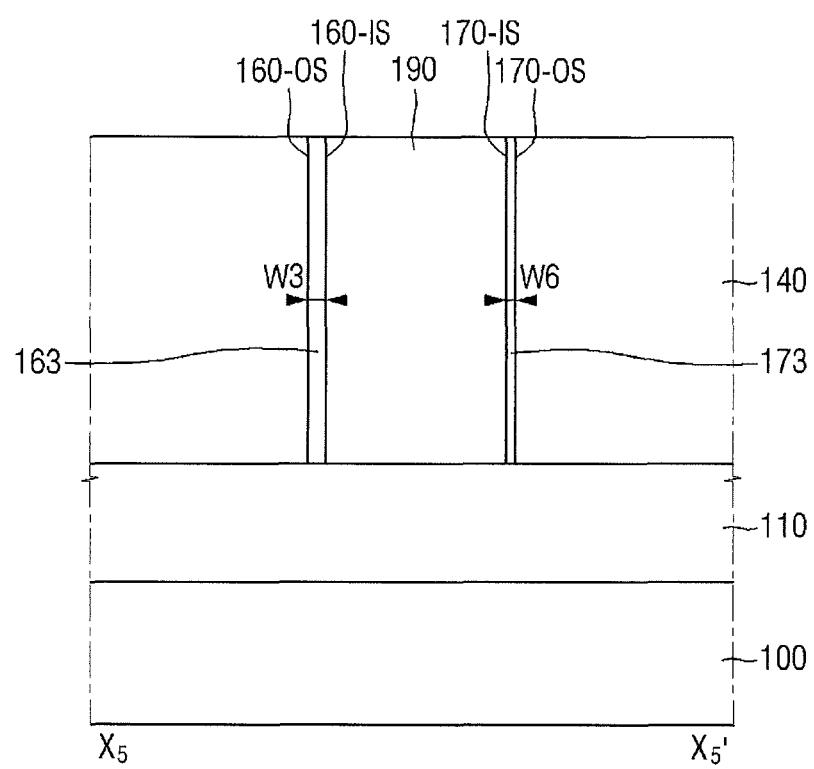
FIG. 16 is a cross-sectional view taken along the line $X_5$-$X_5'$ of FIG. 14.

FIG. 13 is a perspective view of a semiconductor device according to some embodiments of the present inventive concept. FIG. 14 is a plan view of FIG. 13. FIG. 15 is an enlarged view of the area J of FIG. 14. FIG. 16 is a cross-sectional view taken along the line $X_5$-$X_5'$ of FIG. 14.

Referring to FIGS. 13 to 16, the third width W3 and the fifth width W6 may be different from each other.

In some embodiments, the depth of the first recess 163r may be formed to be greater than the depth of the second recess 173r. In these embodiments, the depth may be a value measured in the first direction D1. Therefore, the third width W3 and the fifth width W6 may be different from each other. For example, the third width W3 may be greater than the sixth width W6.

The cross-sectional view taken along the line Y-Y' of FIG. 14 may be the same as FIG. 4. The cross-sectional view taken along the line $X_1$-$X_1'$ of FIG. 14 may be the same as FIG. 5.

Hereinafter, a semiconductor device according to some embodiments of the present inventive concept will be described with reference to FIGS. 2, 17 and 18. For the purpose of clarity of explanation, the aforementioned redundant descriptions will be omitted.

Figure 17:
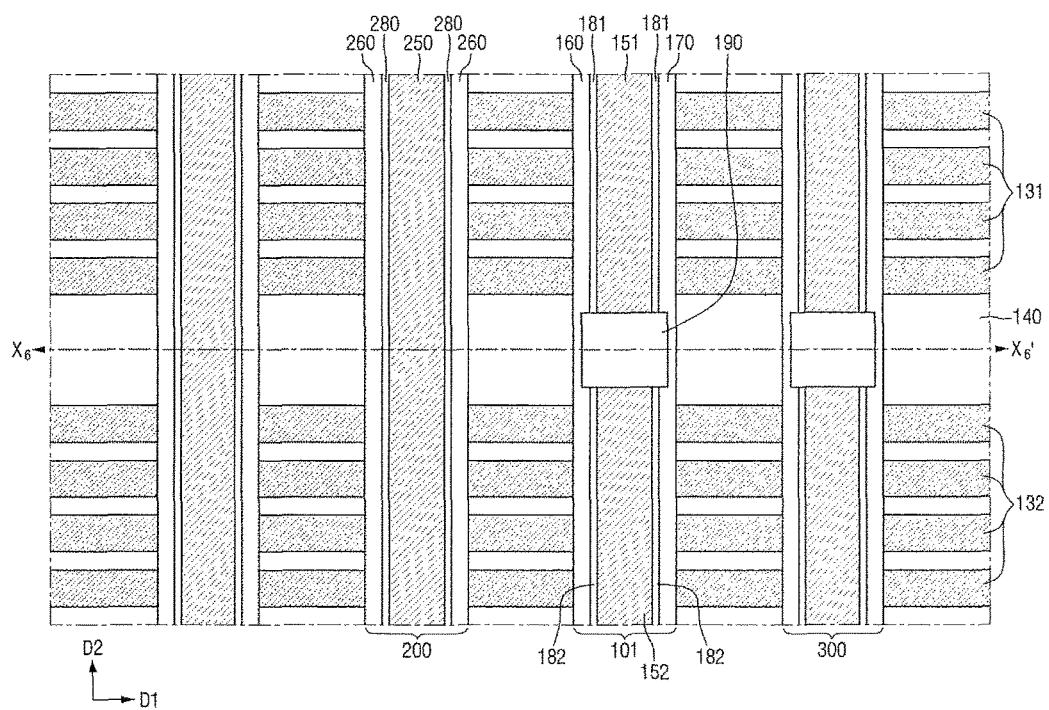
FIG. 17 is a plan view of a semiconductor device according to some embodiments of the present inventive concept.

FIG. 17 is a perspective view of a semiconductor device according to some embodiments of the present inventive concept. FIG. 18 is a cross-sectional view taken along the line $X_6$-$X_6'$ of FIG. 17.

Figure 18:
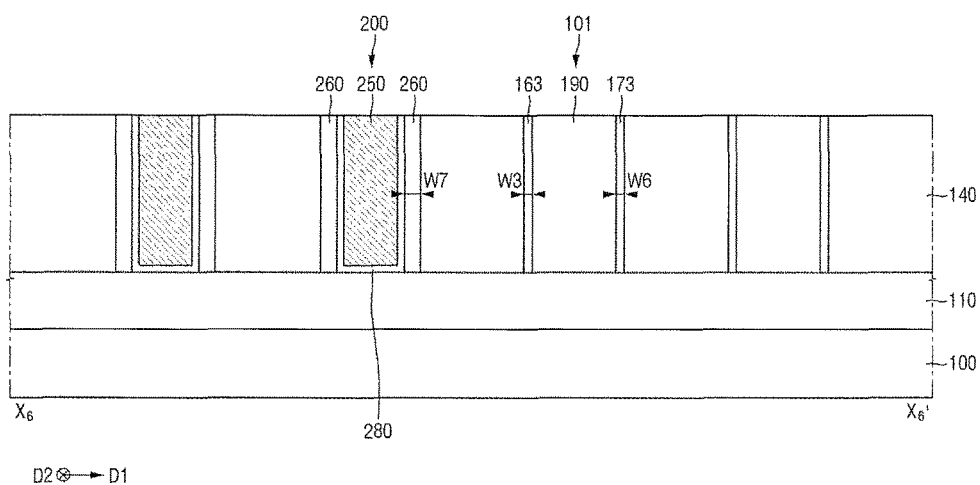
FIG. 18 is a cross-sectional view taken along the line $X_6$-$X_6'$ of FIG. 17.

Referring to FIGS. 17 and 18, the semiconductor device according to some embodiments of the present inventive concept may further include a pair of third gate spacers 260. A first gate structure 100 may be the same as the gate structure shown in FIG. 2. In other words, the first and second spacers 160 and 170 of FIG. 17 may be the same as the first and second spacers 160 and 170 of FIG. 2.

A second gate structure 200 may be disposed in the first direction D1 to be spaced apart from the first gate structure 100.

The second gate structure 200 may include the pair of third gate spacers 260, a third gate electrode 250, and a third gate insulation film 280.

The pair of third gate spacers 260, similarly to the first and second gate spacers 160 and 170, may extend in the second direction D2. The pair of third gate spacers 260 may spaced apart from the first and second gate spacers 160 and 170 in the first direction D1. The pair of third gate spacers 260 may be disposed on the first and second active fin arrays 131 and 132.

The pair of third gate spacers 260 may not include a recess.

Each of the pair of third gate spacers 260 may have a relatively regular width. The width of each of the pair of third gate spacers 260 may be a seventh width W7.

In some embodiments, the seventh width W7 may be greater than the third width W3 and the sixth width W6.

The third gate electrode 250 may be disposed to extend along the pair of third gate spacers 260. The third gate insulation film 280 may be substantially identical to the first and second gate insulation films 181 and 182.

In some embodiments, the plurality of first gate structures 100 may be disposed on the substrate 100 to be spaced apart from each other. Further, the plurality of second gate structures 200 may be disposed on the substrate 100 to be spaced apart from each other.

Hereinafter, a method of manufacturing a display device according to an embodiment of the present inventive concept will be described with reference to FIGS. 2, 17, 18, and 19 to 24. For the purpose of clarity of explanation, the aforementioned redundant descriptions will be omitted.

FIGS. 19 to 24 are cross-sectional views of intermediate steps for illustrating processing steps in the fabrication of semiconductor devices according to some embodiments of the present inventive concept. FIGS. 19 to 24 are cross-sectional views taken along the line $X_6$-$X_6'$ of FIG. 17.

Figure 19:
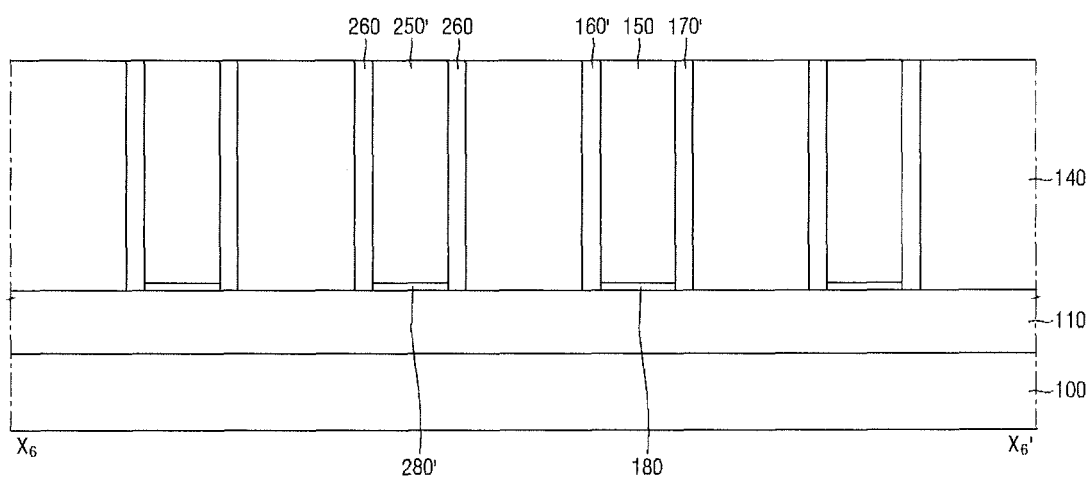
FIGS. 19 to 24 are cross-sectional views illustrating processing steps in the fabrication of a semiconductor device according to some embodiments of the present inventive concept.

Referring to FIGS. 17 and 19, a plurality of dummy gate electrodes spaced apart from each other may be formed on a substrate 100.

The plurality of dummy gate electrodes may include a first dummy gate electrode 150 and a second dummy gate electrode 250'. The first and second dummy electrodes 150 and 250' may be formed to extend in the second direction D2.

Before the formation of the plurality of dummy gate electrodes, first and second active fin arrays 121 and 122 may be formed on the substrate 100. The first and second active fin arrays 121 and 122 may be formed by etching the substrate 100 using dummy spacers. In other words, the first and second active fin arrays 121 and 122 may be formed through a mandrel process, but the present inventive concept is not limited thereto. For example, the first and second active fin arrays 121 and 122 may be formed by using an epitaxial layer formed on a base substrate.

After the formation of the first and second active fin arrays 121 and 122, recesses may be formed around the first and second active fin arrays 121 and 122 by removing a part of the substrate 100. A field insulation film 110 may be formed to fill the recesses around the first and second active fin arrays 121 and 122. The field insulation film 110 may be formed to cover a part of the first and second active fin arrays 121 and 122.

A doping process for adjusting a threshold voltage may be performed on the first and second active fin arrays 121 and 122 protruding from the upper surface of the field insulation film 110, thereby forming first and second semiconductor patterns 131 and 132.

The plurality of dummy gate electrodes may be formed on the first and second active fin arrays 121 and 122 to cross the first and second active fin arrays 121 and 122.

A first dummy gate insulation film 180 may be formed along the bottom surface of the first dummy gate electrode 150. A second dummy gate insulation film 280' may be formed along the bottom surface of the second dummy gate electrode 250'.

A first pre gate spacer 160' and a second pre gate spacer 170' may be formed on the sidewall of the first dummy gate electrode 150. A third gate spacer 260 may be formed on the sidewall of the second dummy gate electrode 250'.

Each of the first pre gate spacer 160' and the second pre gate spacer 170' may include a first portion formed on the first active fin array 121, a second portion formed on the second active fin array 122, and a third portion formed between the first portion and the second portion.

Figure 20:
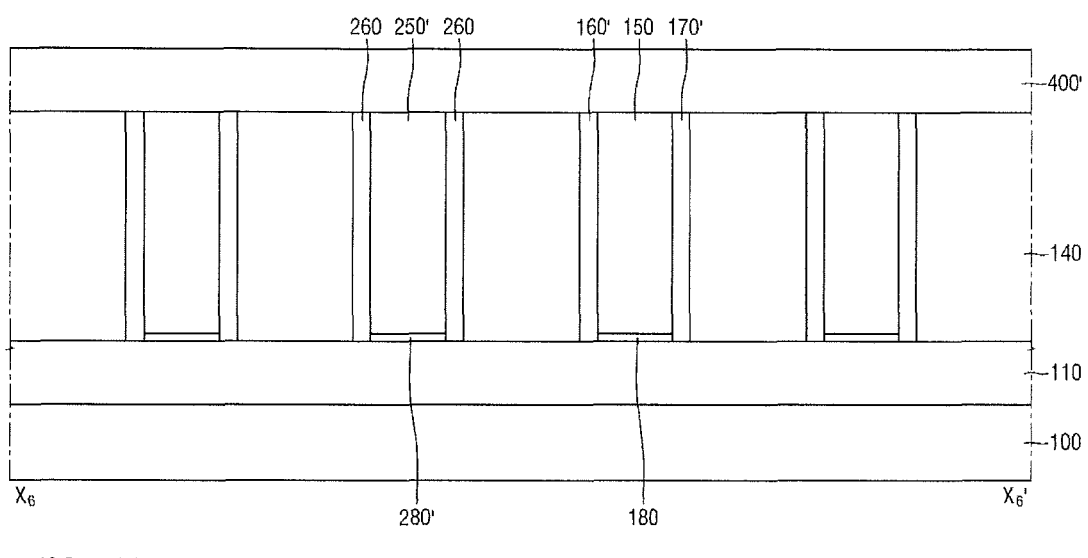
Figure 21:
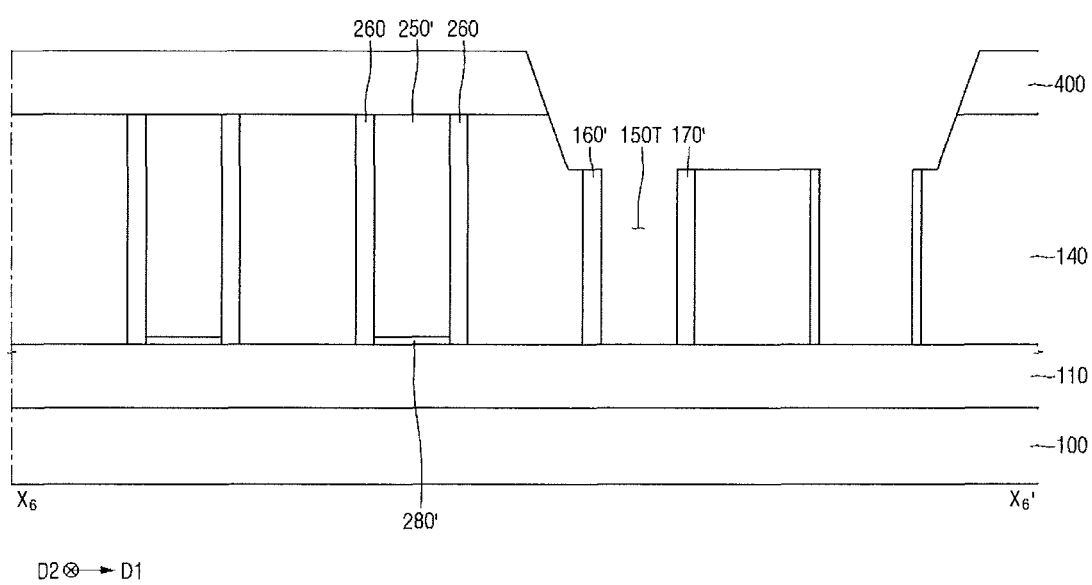

The section of each of the first pre gate spacer 160' and the second pre gate spacer 170', shown in FIGS. 19 to 21, may be a section of the third portion.

Referring to FIGS. 17 and 20, a mask layer 400' may be formed on the interlayer insulation film 140, the first and second pre gate spacers 160' and 170', the third gate spacer 260, and the plurality of dummy gate electrodes.

As illustrated in the figures, the mask layer 400' is a single layer. However, the present inventive concept is not limited thereto. For example, the mask layer 400' may also include a plurality of masks.

Referring to FIGS. 17 and 21, a first trench 150T may be formed between the first pre gate spacer 160' and the second pre gate spacer 170'. The first trench 150T may be formed by removing a part of the first dummy gate electrode 150. The first trench 150T may be formed in the first dummy gate electrode 150.

In particular, a region in which the first dummy gate electrode 150 overlap the first active fin array 121 may not removed. Further, a region in which the first dummy gate electrode 150 overlap the second active fin array 122 may not removed. Only a region between the first active fin array 121 and the second active fin array 122 may be removed.

In other words, a part of the first dummy gate electrode between the third regions of the first pre gate spacer 160' and the second pre gate spacer 170' may be removed.

Due to the formation of the first trench 150T, the first dummy gate electrode 150 may be divided into the plurality of dummy gate electrodes.

The first trench 150T may expose the upper surface of the field insulation film 110.

Due to the formation of the first trench 150T, a mask pattern 400 may be formed. It is shown in the drawings that the sidewall of the mask pattern 400 has an inclination. However, the present disclosure is not limited thereto.

Figure 22:
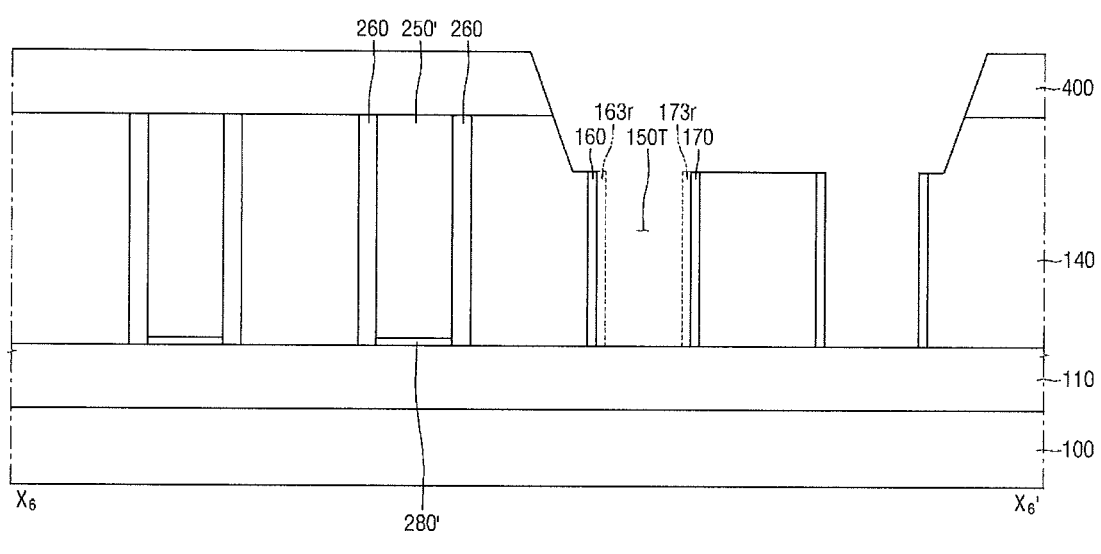

Referring to FIGS. 2, 17 and 22, a part of the first pre gate spacer 160' and a part of the second pre gate spacer 170' may be removed, so as to form a first recess 163r and a second recess 173r, respectively. The first recess 163r may be formed on the third region 163 of the first gate spacer 160. The second recess 173r may be formed on the sixth region 173 of the second gate spacer 170.

In accordance with the formation of the first recess 163r and the second recess 173r, the first and second gate spacers 160 and 170 of FIGS. 2 and 17 may be formed.

Due the formation of the first recess 163r and the second recess 173r, the widths of the third region 163 and the sixth region 173 may be different from the widths of the first region 161, the second region 162, the fourth region 171, and the fifth region 172.

Due the formation of the first recess 163r and the second recess 173r, the width of the first trench 150T may become larger in the first direction D1.

In some embodiments, an etching process may be used in the formation of the first recess 163r and the second recess 173r. In the etching process, an etchant having etching selectivity to Si and SiN may be used.

In the node separation process of the dummy gate electrode, when a node is separated by removing a part of the dummy gate electrode, the material (for example, polysilicon) of the dummy gate electrode may remain without being completely removed. When the remaining material of the dummy gate electrode is not completely removed, failure of the semiconductor device may be caused.

In the method of manufacturing a semiconductor device according to a technical idea of the present inventive concept, through an etching process, the recesses may be formed by removing some of the regions of the first and second pre gate spacers 160' and 170' (for example, regions corresponding to the third region 163 of the first gate spacer 160 and the sixth region 173 of the second gate spacer 170). Due to the formation of the recesses, the remaining material of the dummy gate electrode separated from the first and second pre gate spacers 160' and 170' may be removed through the etching process.

Figure 23:
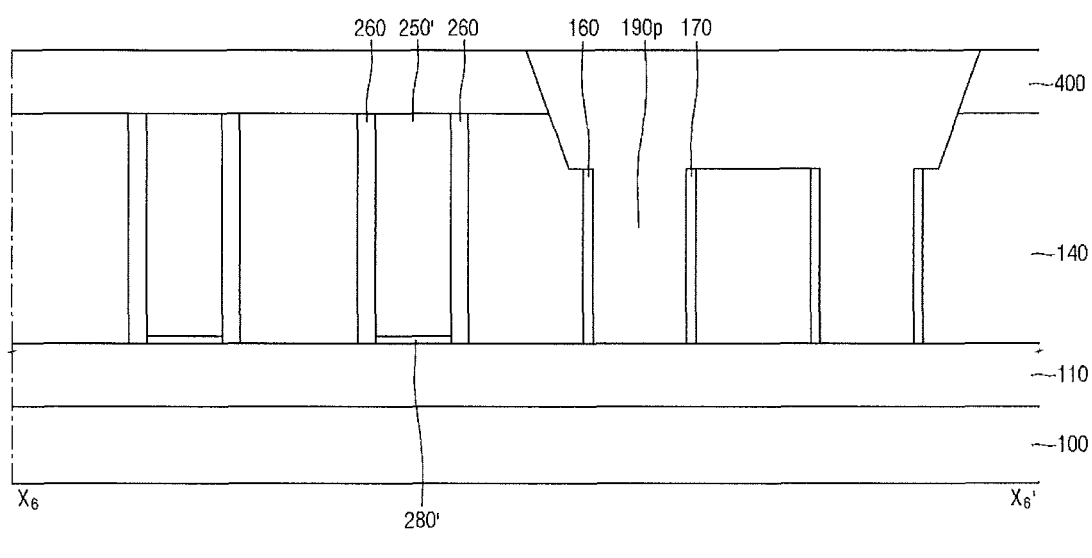

Referring to FIGS. 17 and 23, a pre insulator 190p filling the first trench 150T may be formed. The pre insulator 190p may be formed to the upper surface of the mask pattern 400 or higher than the upper surface thereof.

Figure 24:
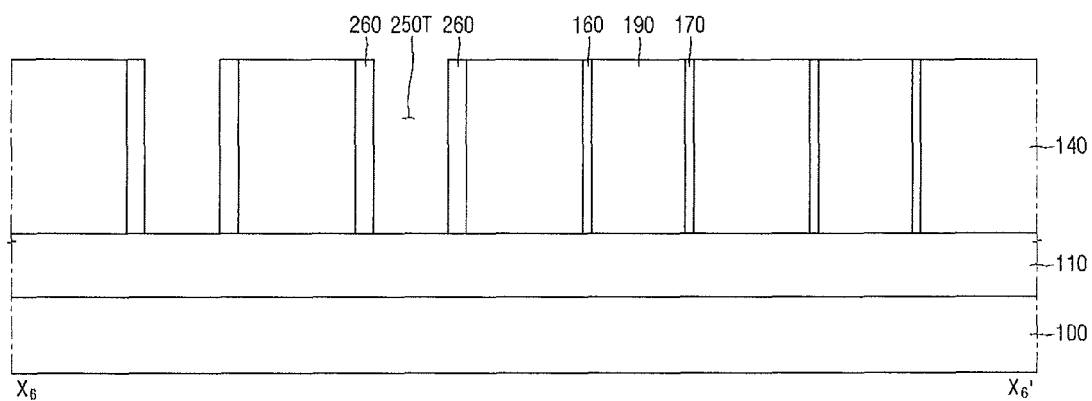

Referring to FIGS. 17 and 24, a second trench 250T and an insulator 190 may be formed.

The mask pattern 400', a part of the free insulator 190p, a part of the interlayer insulation film 140, a part of the second dummy gate electrode 250', and a part of the third dummy gate spacer 260, which are shown in FIG. 23, may be removed. Thus, the insulator 190 may be formed.

However, the present disclosure is not limited thereto. For example, a part of the first gate spacer 160 and a part of the second gate spacer 170 may also be removed. In this case, compared to FIG. 23, the heights of the first and second gate spacers 160 and 170 may also be reduced.

The second trench 250T may be formed by removing the second dummy gate electrode 250'. The second trench 250T may extend along the second direction D2. In other words, the entire second dummy gate electrode 250' may be removed.

The sidewall of the second trench 250T may be defined by the third gate spacer 260. The second trench 250T may expose the upper surface of the field insulation film 110 and the upper surfaces of the first and second active fin arrays 121 and 122.

In these embodiments, after the formation of the insulator 190, the remaining portion of the first dummy gate electrode 150 may also be removed. In other words, the first dummy gate electrode 150, divided into a plurality of portions, may also be removed.

Referring to FIG. 17, the third gate electrode 250 may be formed in the second trench 250T. In these embodiments, the first and second gate electrodes 151 and 152 may also be formed.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device, comprising:
   a first active fin array and a second active fin array, the first and second active fin arrays being disposed on a substrate extending in a first direction and spaced apart from each other in a second direction crossing the first direction;
a pair of first gate spacers disposed on the first and second active fin arrays extending in the second direction, each of the pair of first gate spacers including a first region having a first width, a second region having a second width, and a third region between the first region and the second region and having a third width; and
first and second gate electrodes spaced apart from each other, the first gate electrode disposed between the first regions of the pair of first gate spacers and the second gate electrode disposed between the second regions of the pair of first gate spacers,
wherein the first regions of the pair of first gate spacers are disposed on the first active fin array, the second regions of the pair of first gate spacers are disposed on the second active fin array, and the third regions of the pair of first gate spacers are disposed between the first active fin array and the second active fin array; and
wherein each of the first and second widths is greater than the third width.

2. The semiconductor device of claim 1, further comprising an insulator between the third regions of the pair of first gate spacers.

3. The semiconductor device of claim 2, wherein the insulator is in contact with the first gate electrode, the second gate electrode, and the third regions of the pair of first gate spacers.

4. The semiconductor device of claim 2, wherein the insulator includes a first portion between the first region of each of the pair of first gate spacers and the second region of each of the pair of first gate spacers, and a second portion between the first gate electrode and the second gate electrode.

5. The semiconductor device of claim 2,
wherein the first gate electrode overlaps the first active fin array and does not overlap the second active fin array;
wherein the second gate electrode overlaps the second active fin array and does not overlap the first active fin array; and
wherein the insulator does not overlap the first and second active fin arrays.

6. The semiconductor device of claim 2, further comprising a field insulation film disposed on the substrate to cover at least a part of the first and second active fin arrays,
wherein a bottom surface of the insulator is disposed to be in contact with the field insulation film.

7. The semiconductor device of claim 1, further comprising:
a first gate insulation film disposed between the first region of the pair of first gate spacers and the first gate electrode and disposed on sidewalls of the first region; and
a second gate insulation film disposed between the second region of the pair of first gate spacers and the second gate electrode and disposed on sidewalls of the second region,
wherein the first and second gate insulation films are not disposed between the first gate electrode and an insulator, between the second gate electrode and the insulator, and on sidewalls of the third regions of the pair of first gate spacers.

8. The semiconductor device of claim 1, further comprising a pair of second gate spacers extending in the second direction and disposed on the first and second active fin arrays to be spaced apart from the pair of first gate spacers in the first direction,
wherein each of the pair of second gate spacers has a fourth width which is greater than the third width.

9. A semiconductor device, comprising:
a first active fin array and a second active fin array, the first and second active fin arrays being on a substrate extending in a first direction and spaced apart from each other in a second direction crossing the first direction;
a first gate electrode overlapping the first active fin array and not overlapping the second active fin array;
a second gate electrode overlapping the second active fin array and not overlapping the first active fin array that is spaced apart from the first gate electrode in the second direction;
an insulator between the first gate electrode and the second gate electrode;
a first gate spacer on a first sidewall of the first gate electrode, a first sidewall of the second gate electrode and a first sidewall of the insulator;
a second gate spacer on a second sidewall of the first gate electrode; and
a third gate spacer on a second sidewall of the second gate electrode,
wherein the first gate spacer includes a first recess formed on an inner sidewall of the first gate spacer; and
wherein a part of the insulator is inserted into the first recess.

10. The semiconductor device of claim 9:
wherein the first gate electrode includes a first surface connecting both sidewalls of the first gate electrode and facing the second gate electrode;
wherein the second gate electrode includes a second surface connecting both sidewalls of the second gate electrode and facing the first surface; and
wherein the insulator is in contact with the first surface and the second surface.

11. The semiconductor device of claim 9, wherein a width of a first region of the first gate spacer disposed on the first sidewall of the first gate electrode and a width of a second region of the first gate spacer disposed on the first sidewall of the second gate electrode are greater than a width of a third region of the first gate spacer disposed on the first sidewall of the insulator.

12. The semiconductor device of claim 11, further comprising a fourth gate spacer disposed on the second sidewall of the insulator,
wherein a width of the fourth gate spacer is different from the width of the third region of the first gate spacer.

13. The semiconductor device of claim 9, further comprising a fourth gate spacer disposed on the second sidewall of the insulator,
wherein the fourth gate spacer includes a second recess formed in an inner sidewall of the fourth gate spacer; and
wherein a remaining portion of the insulator is inserted in the second recess.

14. The semiconductor device of claim 13, wherein a width of a portion of the first gate spacer disposed on the first sidewall of the insulator is different from the width of the fourth gate spacer.

15. The semiconductor device of claim 9, wherein the insulator does not overlap the first and second active fin arrays.

16. A semiconductor device, comprising:
first and second active fin arrays on a substrate extending in a first direction and spaced apart from each other in a second direction crossing the first direction;
first and second gate spacers on the first and second active fin arrays extending in the second direction, each of the first and second gate spacers including a first region having a first width, a second region having a second width, and a third region between the first region and the second region and having a third width; and
wherein each of the first and second widths is greater than the third width.

17. The device of claim 16, further comprising first and second gate electrodes spaced apart from each other, the first gate electrode disposed between the first regions of the first and second gate spacers and the second gate electrode disposed between the second regions of the first and second gate spacers,
wherein the first regions of the first and second gate spacers are disposed on the first active fin array, the second regions of the first and second gate spacers are disposed on the second active fin array, and the third regions of the first and second gate spacers are disposed between the first active fin array and the second active fin array.

18. The device of claim 17, further comprising an insulator between the third regions of the first and second gate spacers.

19. The device of claim 18, wherein the insulator is in contact with the first gate electrode, the second gate electrode, and the third regions of the first and second gate spacers.

20. The device of claim 18, wherein the insulator includes a first portion between the first region of each of the first and second gate spacers and the second region of each of fourth and fifth gate spacers, and a second portion between the first gate electrode and the second gate electrode.

* * * * *